United States Patent [19]
Robinson et al.

[11] Patent Number: 6,059,605
[45] Date of Patent: May 9, 2000

[54] WATTHOUR METER SOCKET ADAPTER

[75] Inventors: Darrell Robinson, Highland Township; Allen V. Pruehs, Howell; Karl R. Loehr, Novi, all of Mich.

[73] Assignee: Ekstrom Industries, Inc., Farmington Hills, Mich.

[21] Appl. No.: 09/182,167

[22] Filed: Oct. 29, 1998

Related U.S. Application Data

[60] Provisional application No. 60/064,355, Oct. 30, 1997.

[51] Int. Cl.[7] .................................................. H01R 33/945
[52] U.S. Cl. ........................................... 439/517; 439/146
[58] Field of Search ..................................... 439/167, 146, 439/508, 517, 733.1

[56] References Cited

U.S. PATENT DOCUMENTS

| | | |
|---|---|---|
| Re. 34,531 | 2/1994 | Bell et al. . |
| 1,645,539 | 10/1927 | Mau . |
| 2,030,522 | 2/1936 | Johansson . |
| 2,105,396 | 1/1938 | Bakke ..................................... 439/167 |
| 2,468,368 | 4/1949 | Jackson . |
| 2,911,616 | 3/1959 | Townsend . |
| 3,031,640 | 4/1962 | McKee . |
| 3,050,706 | 4/1962 | Kitscha . |
| 3,061,763 | 10/1962 | Ekstrom . |
| 3,066,204 | 11/1962 | Mobarry . |
| 3,221,216 | 11/1965 | Kobryner . |
| 3,596,234 | 7/1971 | Supienza . |
| 3,636,498 | 1/1972 | Mc Quarrie ............................ 439/167 |

(List continued on next page.)

FOREIGN PATENT DOCUMENTS 0340951 4/1989 European Pat. Off. .

OTHER PUBLICATIONS

Grote & Hartman Product Catalog, 1993.

Long Life for Power Contacts, Machine Design, Jan. 11, 1990.

Series Reconnect Device Series SRD–51900, Scientific Atlanta Instrumentation Group, 1992.

*Primary Examiner*—Khiem Nguyen
*Assistant Examiner*—J. F. Duverne
*Attorney, Agent, or Firm*—Young & Basile, PC

[57] ABSTRACT

A watthour meter socket adapter has front and rear housings which encompassingly surround jaw contacts, electrical conductors and terminals. Apertures in the front housing allow insertion of a meter blade terminal into the jaw contacts. The jaw contacts include a spring clip having a recess sized for slidably receiving one side of a conductor to dispose the conductor for direct contact with a meter blade terminal. At least two conductors overlay each other and are separated by an insulating pad. The terminals include a collar having a recess for partially receiving one side of a circular conductor or in the case of a rectangular bus bar conductor, a bore is offset to one side edge of the terminal collar for receiving a lower portion of the bus bar. The upper portion of the end of the conductor is folded over to form a flange overlaying a bottom portion of a first bore in the terminal collar and engages an external conductor. A surge ground frame includes a unitary terminal portion overlaying a terminal portion of the housing. A communication connector is mounted in the sidewall of the housing for external communications to the adapter. A lockable cover is provided for the communications connector.

74 Claims, 21 Drawing Sheets

U.S. PATENT DOCUMENTS

| | | |
|---|---|---|
| 3,643,209 | 2/1972 | Coston . |
| 3,657,683 | 4/1972 | Grieshaber . |
| 4,127,924 | 12/1978 | Ross . |
| 4,213,669 | 7/1980 | Wittes . |
| 4,388,670 | 6/1983 | Billhartz . |
| 4,772,213 | 9/1988 | Bell et al. . |
| 4,823,572 | 4/1989 | Signorelli . |
| 4,892,485 | 1/1990 | Patton . |
| 4,977,482 | 12/1990 | Landgon et al. . |
| 5,023,747 | 6/1991 | Lindsay . |
| 5,088,004 | 2/1992 | Howell . |
| 5,129,841 | 7/1992 | Alina et al. . |
| 5,145,403 | 9/1992 | Schaffert et al. . |
| 5,145,422 | 9/1992 | Fry . |
| 5,181,166 | 1/1993 | Howell . |
| 5,207,595 | 5/1993 | Learmont et al. . |
| 5,385,486 | 1/1995 | Robinson et al. . |
| 5,423,695 | 6/1995 | Robinson et al. . |
| 5,571,031 | 11/1996 | Robinson et al. . |
| 5,577,933 | 11/1996 | Robinson et al. . |
| 5,586,913 | 12/1996 | Robinson et al. . |
| 5,588,874 | 12/1996 | Pruehs et al. . |
| 5,590,179 | 12/1996 | Shincovich et al. . |
| 5,704,804 | 1/1998 | Robinson et al. . |

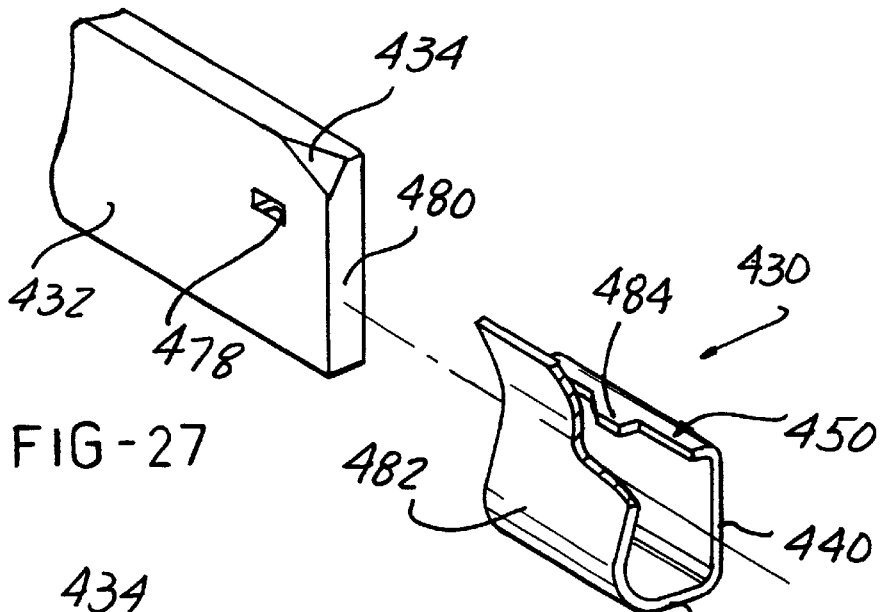
FIG-27
FIG-28
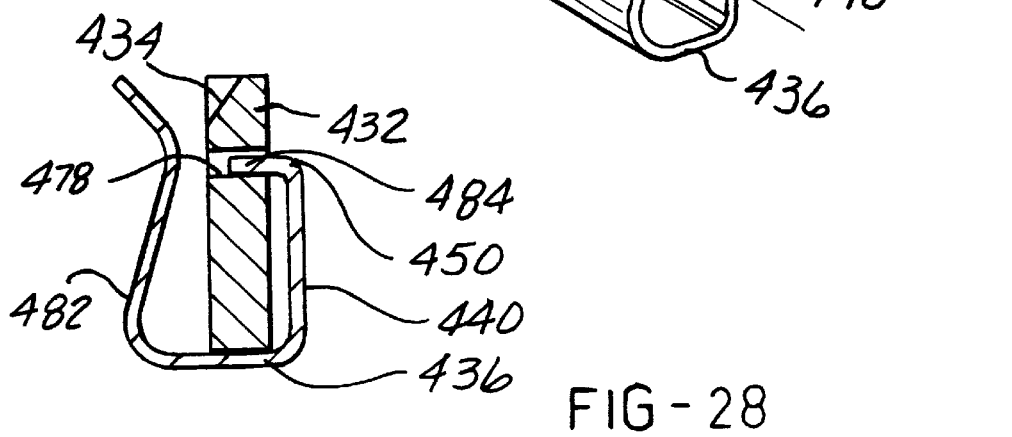
FIG-29

WATTHOUR METER SOCKET ADAPTER

CROSS-REFERENCE TO RELATED APPLICATIONS

This application describes subject matter which is also described in related co-pending applications, namely, Ser. No. 08/866,703, filed May 30, 1997 in the name of Darrell Robinson et al., and entitled "Watthour Meter Socket Jaw Adapters with Snap-On Jaw Contacts"; Ser. No. 08/611,933, filed Mar. 6, 1997 in the name of Darrell Robinson et al., now U.S. Pat. No. 5,704,804 issued Jan. 6, 1998, and entitled "Apparatus for Grounding External Metal Watthour Meter Component"; Ser. No. 08/656,774, filed Jun. 3, 1996 in the name of Darrell Robinson et al., and entitled "Watthour Socket Adapter with Improved Electrical Connections"; and Ser. No. 09/148,235, filed Sep. 4, 1998 in the name of Darrell Robinson et al., and entitled "Jaw Blades For Watthour Meter Socket Adapter.

Applicants also claim the benefit of the priority date of provisional patent application Ser. No. 60/064,355, filed Oct. 30, 1997, in the names of Darrell Robinson, Allen V. Pruehs and Karl R. Loehr, and entitled "Watthour Meter Socket Adapter", the contents of which are incorporated herein in their entirety by reference.

BACKGROUND OF THE INVENTION

The present invention relates, in general, to electrical watthour meters and, specifically, to watthour meter mounting enclosures and, more specifically to watthour meter socket adapters.

In the electric utility industry, plug-in, socket-type watthour meters are commonly employed to measure electrical power consumption at a residential or commercial building establishment. A cabinet is typically mounted on an outside wall of the residence or building and contains a meter socket having pairs of line and load contacts which are connected to electric power line conductors extending from the utility power network and electric load conductors connected to the residential or building establishment power distribution network. The contacts receive blade terminals on a plug-in watthour meter to complete an electric circuit through the meter between the line and load terminals mounted in the cabinet for the measurement of electrical power consumption.

S-type, socket-type, plug-in watthour meters have replaced older A base bottom connected meters which were formed of a single piece housing in which the watthour meter was fixedly mounted along with compression terminals which provide connection to the utility power lines and the building load distribution network.

In an installation involving an A-base bottom connected meter, an A to S socket adapter is used to allow a new S-type watthour meter to be installed. The socket type meter has outwardly extending blade terminals which are insertable into the jaw contacts in the cabinet of a S-type meter socket. The socket adapter includes its own set of female jaw contacts which receive the male blade terminals of the S-type plug-in, socket-type meter.

Although such A to S socket adapters have enjoyed widespread, reliable use over a long period of time, the Applicants devised improvements to such socket adapters as described in U.S. Pat. Nos. 5,571,031 and 5,577,933. Such improvements included a unique safety shield which completely surrounds all of the exposed portions of the jaw contacts in the socket adapter except for small slot sized to slidably receive the blade terminals of a watthour meter. In one embodiment, the safety shield is formed as an integral part of a first, front housing which is mountable in a second or rear housing to complete the socket adapter. The front and rear housings form an internal cavity within the socket adapter in which the jaw contacts, electrical conductors and terminals are disposed. The jaw contacts are received in receptacles formed in the safety shield thereby eliminating the need for separate mounting fasteners employed in previously devised socket adapters to mount each jaw terminal to the base or rear wall of the socket adapter.

Applicants also devised an improved jaw contact which minimized magnetic fields since electric currents flow from the conductors to the end of the contact clips and from the contact clips to the blade terminal of a watthour meter in the same direction. The spring clips and contact clips forming the jaw contact were affixedly secured to rigid bus bars by rivets to eliminate the need for costly threaded fasteners and apertures. The use of rigid bus bars as the electrical conductors provides a higher current carrying capacity than previously employed solid or stranded wire conductors. The jaw contacts also have a unique angular end design which substantially reduce the insertion forces required to slidably insert the blade terminals of the watthour meter into the jaw contacts; while at the same time requiring lower withdrawal forces to remove the watthour meter from the socket adapter.

The conductors employed in Applicant's prior watthour meter were installed without any external insulation since internal dividers formed on the front and rear housing provided the necessary insulation between adjacent conductors as well as the long flash distance required by electrical utility standards. Applicants' prior design also included a unique surge ground ring which terminated in a pair of mounting flanges extending from opposite ends of an angular portion to overlay a front cover filler of the front housing. A flange extends from one of the mounting flanges and passes through an aperture formed in a terminal cover before being positioned in proximity to a rim filler extension to enable a single wire seal to be passed through an aperture in the flange and an aperture in one end of a sealing ring to seal the sealing ring in the terminal cover on the watthour meter socket adapter.

Unique terminals were also disclosed in the aforementioned patents and included a collar having first and second axially extending bores. An external electrical power line load conductor is secured in the first bore of each collar by means of fasteners extendible through the collar. The second bore receives one end of one of the bus bar conductors which is in turn disposed in electrical contact with the external electrical conductor.

A unique potential jaw contact was also disclosed for use in a watthour meter socket adapter. The potential jaw contact is in the form of a three finger contact having two spaced legs extending outward from a base to which a potential lead or conductor is attached. An intermediate leg extending in an opposite angular direction from two spaced legs is disposed between the pair of legs to form a slot for receiving a blade terminal.

While Applicants' improved watthour meter socket adapter disclosed in U.S. Pat. Nos. 5,571,031 and 5,577,933 created many advances in the design of A to S watthour socket adapters, Applicants have found that further improvements could be made to Applicant's prior watthour meter socket adapter design to increase the reliability, ease of use, to improve the electrical performance characteristics of the socket adapter, as well as to reduce the manufacturing costs of the socket adapter.

Further, in previously devised watthour meter socket adapters, the insulating barriers or dividers between adjacent terminals were provided in unequal thicknesses, particularly between adjacent terminals carrying different phase line or load currents. This required special design consideration in the construction of the watthour meter socket adapter. Thus, it would be desirable to provide a terminal design for a watthour meter socket adapter which enables the spacing between adjacent terminals to equal.

SUMMARY OF THE INVENTION

The present invention is a watthour meter socket adapter suited for converting a bottom connected watthour meter to a socket-type watthour meter.

According to the present invention, a plurality of jaw contacts are connected to individual terminals by electrical conductors, all of which are housed within front and rear housings which are joined together and encompassingly surround the jaw contacts, the conductors and the terminals. Apertures formed in the front housing are alignable with the jaw contacts to form a safety shield preventing access to the jaw contacts except for a blade terminal of a watthour meter which is insertible through the apertures in the safety shield.

The jaw contacts are movably connected to one end of the conductors. The jaw contacts comprise a spring clip having means for slidably receiving an electrical conductor therein. The spring clip is formed with a base having an opposed side legs extending therefrom. One of the side legs includes a recess sized to slidably receive the conductor therein so as to dispose the conductor into direct contact with a blade terminal of a watthour meter inserted between the conductor and the other side leg without the need for a fastener to secure the spring clip to the conductor. In alternate embodiments, an aperture or recess is formed through or along one side edge of a polygonal shaped bus bar conductor and receives a projection formed on one side leg of a spring clip for mounting the spring clip to the conductor in a snap-in mounting arrangement. The spring clip can also be formed as a bent wire frame having one pair of side legs spaced to engage a watthour meter blade terminal and connected to a second pair of side legs and terminating in angularly extending projections which engage a pair of recesses formed in the conductor, such as recesses formed along one side edge of the conductor or apertures extending completely through an intermediate portion of the conductor. This simplifies the construction of and reduces the cost of interconnecting the jaw contacts to the individual conductors.

Alternately, the conductors comprise rectangular bus bars having an opened ended slot projecting axially inward from one end. A spring clip is movably mounted in the slot with one side leg of the spring clip engagable with the bus bar and an opposite side leg spaced from the bus bar to define a slot for receiving a blade terminal of a watthour meter such that the spring clip biases the blade terminal of the watthour meter into direct contact with the bus bar. In this latter embodiment, the side legs may be split by means of a slot into a pair of contact fingers. Opposed pairs of contact fingers may have contact surfaces disposed at different heights along the length of the spring clip to stagger the push-in insertion force resistance provided by the spring clip.

Preferably, the conductors in the socket adapter of the present invention are preplated conductors without external insulation. Where at least one conductor overlays another conductor between the terminals and the jaw contacts, a separate insulation means or pad is interposed between the overlapped portions of the conductors. Mounting means are formed in the housing for fixedly securing the insulation means or pad in place.

The terminals include a terminal collar having a first bore sized to receive an external electrical conductor insertable through an open end of the housing.

A threaded fastener is extendible through the collar in intersecting arrangement with the first bore to secure the external conductor to another conductor in the terminal collar. A second bore is formed in the terminal collar in communication with the first bore and receives one end of the one of the conductors in the housing. A portion of the conductor extends from the second bore into the first bore into direct contact with an external electrical conductor disposed in the first bore.

In the embodiment where the conductor comprises a circular cross-section conductor, the second bore is formed to enable a portion of the circular cross-section conductor to project into the first bore. In the embodiment employing a rectangular cross-section bus bar, the second bore is offset toward one side edge of the terminal collar for receiving a lower portion of one end of a conductor. An upper portion of the one end of the conductor is folded over to form a flange overlaying a bottom portion of the first bore in the terminal collar. The flange engages the external conductor. This folded over flange end of the conductor enables pre-plated conductors to be employed for all contact surfaces with other conductors and avoids the cut edge previously formed in bus bars which directly contacted the external conductor and which required costly plating after manufacture to cover the raw edge.

The present socket adapter includes a unique surge ground frame having a ring portion disposed within the annular side wall of the housing and joined to a terminal portion overlaying a terminal portion of the housing. The terminal portion of the surge ground frame includes wall portions alignable with and engageable with fasteners extendible through the front and rear housings to join the front and rear housings together and to the surge ground frame. A hanger extends from the ring of the surge ground frame and includes a pad having an aperture alignable with an aperture in the housing for receiving a fastener used to attach the housing to a mount attachable to a support surface.

The ring of the surge ground frame has an annular discontinuity formed by first and second spaced ends. The first and second spaced ends are disposed adjacent to a rim filler integrally extending from the front housing. The rim filler normally fills the annular discontinuity in the annular side wall of the rear housing and a discontinuity in the ring of the surge ground frame. However, the rim filler is frangible from the front housing to enable an opening to be formed allowing access to the interior of the housing for external conductors or cables.

In other features of the present socket adapter, an aperture is formed in the housing, preferably in the side wall of the rear housing, for mounting a communications connector or strain relief in the housing to allow external communication through the socket adapter.

Cover means are provided for removably covering the communications connector or strain relief mounted on the sidewall of the housing. Preferably, the cover means includes means for lockably mounting the cover means over the communications connector. An aperture is preferably formed in the sidewall housing for receiving a fastener to fixedly mount the ground tab of the surge ground frame to the housing and to external ground connected to the fastener. In this embodiment, a flange is formed on the cover means and includes an aperture alignable with the aperture in the sidewall of the housing for receiving the fastener. A slotted flange extends perpendicularly from the first flange. A wire seal is engaged with the fastener and the flange slot to sealingly connect the fastener to the housing for anti-theft indication.

In addition, means are formed on the front housing for supporting a switch in the front housing in position for engagement with a watthour meter when the meter is mounted in the housing. For example, the switch can be connected to current transformers in the housing and has an actuator extending from a switch body engageable by the base of a watthour meter inserted into the housing. Movement of the actuator opens a contact within the switch body to disconnect the line and load connections of the current transformer. Alternately, the switch can be employed as part of a theft detection or deterrent system by generating a signal when the meter is removed from the housing.

A three finger potential terminal formed of first and second spaced legs extending from a common base and a third intermediate leg interposed between the first and second legs and extending oppositely angularly from the first and second leg to define a slot receiving a blade terminal therein is mounted within the barrier means formed on the rear housing and seats within guides formed on the rear housing. Pockets are formed within the recesses on a rear surface of the front housing. Two of the pockets are alignable with and fixedly engage outer ends of the first and second fingers of the potential jaw contact. The third finger is movably disposed within a third pocket to allow movement of the third finger relative to the first and second fingers for insertion of a blade terminal through an aperture in the front housing into the potential jaw contact.

A potential terminal clip receives a conductor extending from the potential jaw contact and is mountable in a terminal collar seated between dividers in the terminal portion of the front and rear housings. An aperture is formed in a front wall of the terminal portion of the front housing allowing visible access to the interior of the housing to verify the position of an external conductor inserted through an open end between the front and rear housings into the potential terminal.

Dividers are formed on at least the rear housing and, preferably, also on the front housing to form channels receiving the individual terminals therein. The terminals are formed of a constant width. This enables the terminals to be equally spaced across the width of the front and rear housings without the need for increased insulation thickness on certain dividers as in previously devised watthour meter socket adapters.

BRIEF DESCRIPTION OF THE DRAWING

The various features, advantages and other uses of the present invention will become more apparent by referring to the following detailed description and drawing in which:

FIG. 27 is an exploded perspective view of yet another mounting arrangement of a spring clip and electrical conductor according to the present invention;

FIG. 28 is partially cross sectioned, end view of the assembled spring clip and electrical conductor of FIG. 27; and FIG. 29 is an exploded perspective view of yet another embodiment of a mounting arrangement of a spring clip and electrical conductor according to the present invention.

DESCRIPTION OF THE PREFERRED EMBODIMENTS

Figure 1:
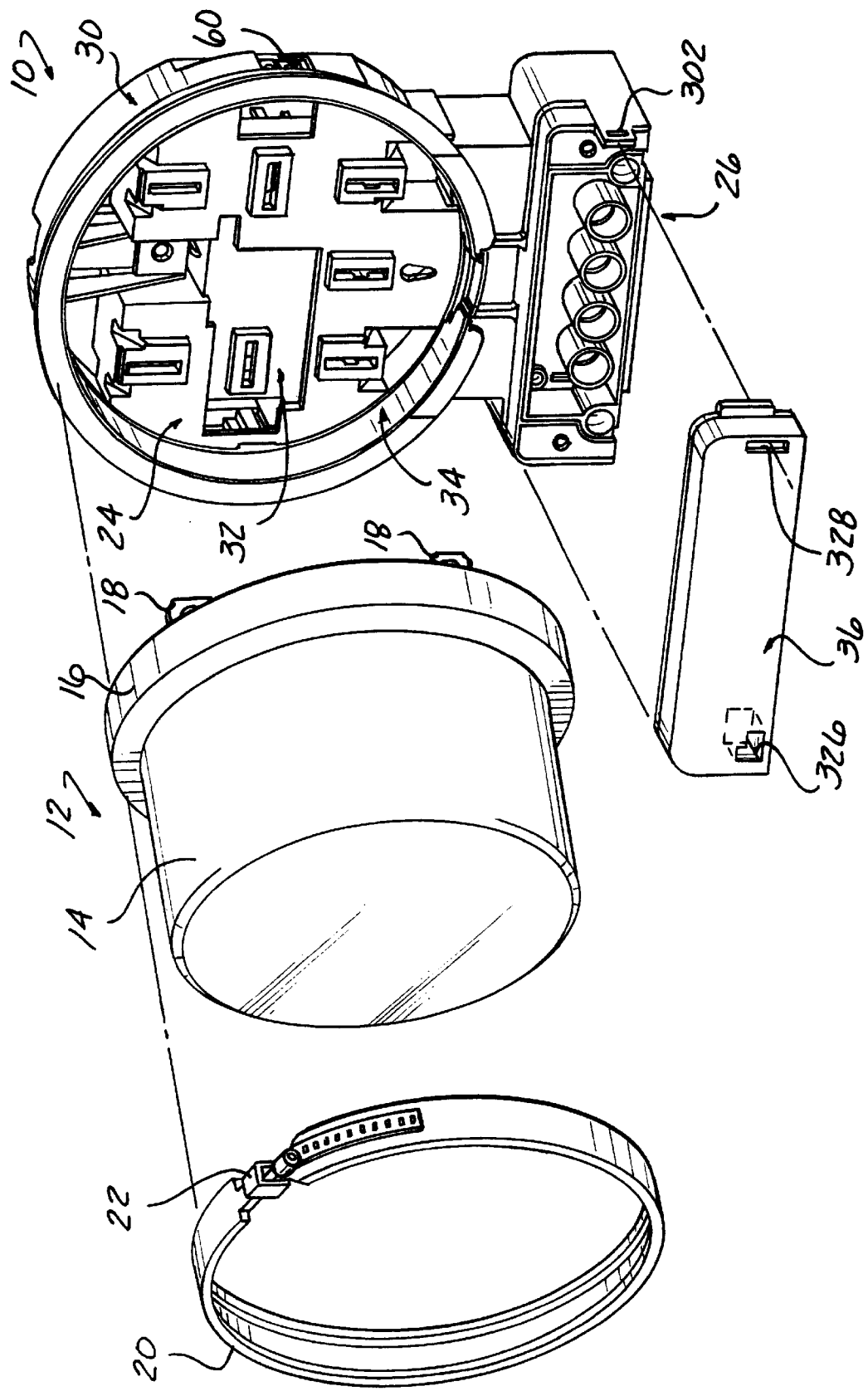
FIG. 1 is an exploded, perspective view of a watthour meter socket adapter according to the present invention used with a watthour meter and a sealing ring.

Refer now to the drawing, and to FIGS. 1–23 in particular, there is depicted an improved watthour meter socket adapter 10.

As shown in FIG. 1, a single socket and bottom connected meter to meter socket adapter 10 (hereafter referred to as a "socket adapter") receives a conventional, socket-type watthour meter 12 in a push-in, snap-in connection. As is well known, the socket-type watthour meter 12 includes a cover 14 which encloses the internal mechanism and gages of the watthour meter 12. An annular mounting flange 16 extends radially outward from a base of the watthour meter 12 and provides a mounting connection to the socket adapter 10, as described hereafter. A plurality of blade terminals 18, only two of which are shown in FIG. 1, are provided in a predetermined number and arrangement depending upon the type of electrical service provided to a customer, i.e., single phase, three phase, etc. The blade terminals 18 extend outward from the base of the watthour meter 12 and respectively engage jaw contacts in the socket adapter 10, as also described hereafter.

As is also conventional, a sealing ring 20 is provided to releasibly enclose the mounting flange 16 of the watthour meter 12 and the corresponding mounting flange on the socket adapter 10 to sealingly mount the watthour meter 12 on the socket adapter 10. The sealing ring 20 is in the form of an annular band having a generally U-shaped cross section. The sealing ring 20 is sized to sealingly engage opposite sides of the mounting flange 16 on the watthour meter 12 and the corresponding mounting flange on the socket adapter 10. A lock device, such as a seal ring lock 22, is provided on the free ends of the sealing ring 20 for locking the ends of the sealing ring 20 about the mounting flanges on the watthour meter 12 and the socket adapter 10.

The socket adapter 10, by way of example only, is depicted as a bottom type socket adapter having a watthour meter receiving portion denoted generally by reference number 24 and an adjacent terminal portion 26. The watthour meter receiving portion 24 surrounds the jaw contacts which receive the blade terminals 18 of a watthour meter 12. The terminal portion 26, as described in greater detail hereafter, provides terminal connection to the electric utility company line conductors and the building or residence load distribution network.

Figure 2:
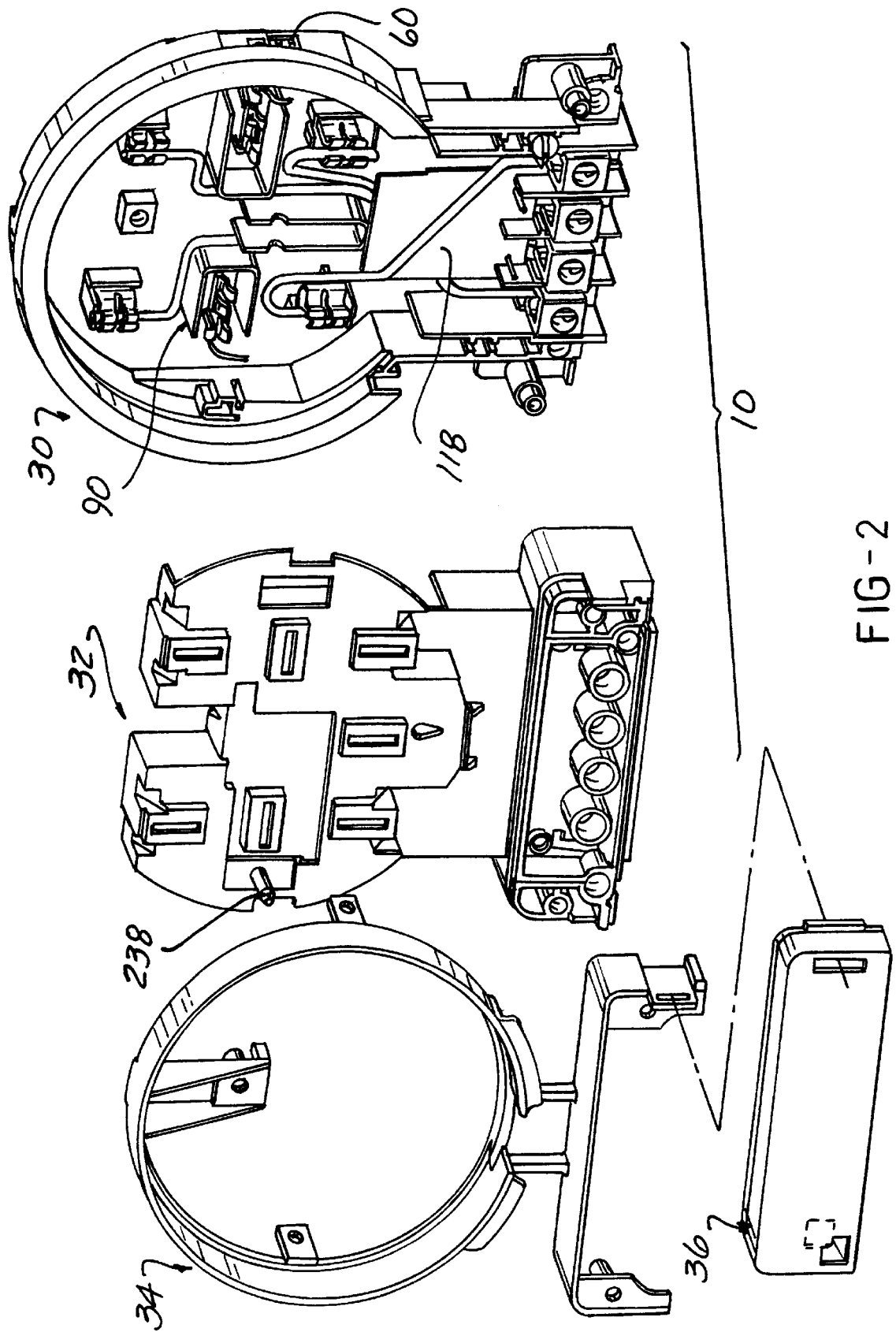
FIG. 2 is an exploded, perspective view of the watthour meter socket adapter shown in FIG. 1.
Figure 3:
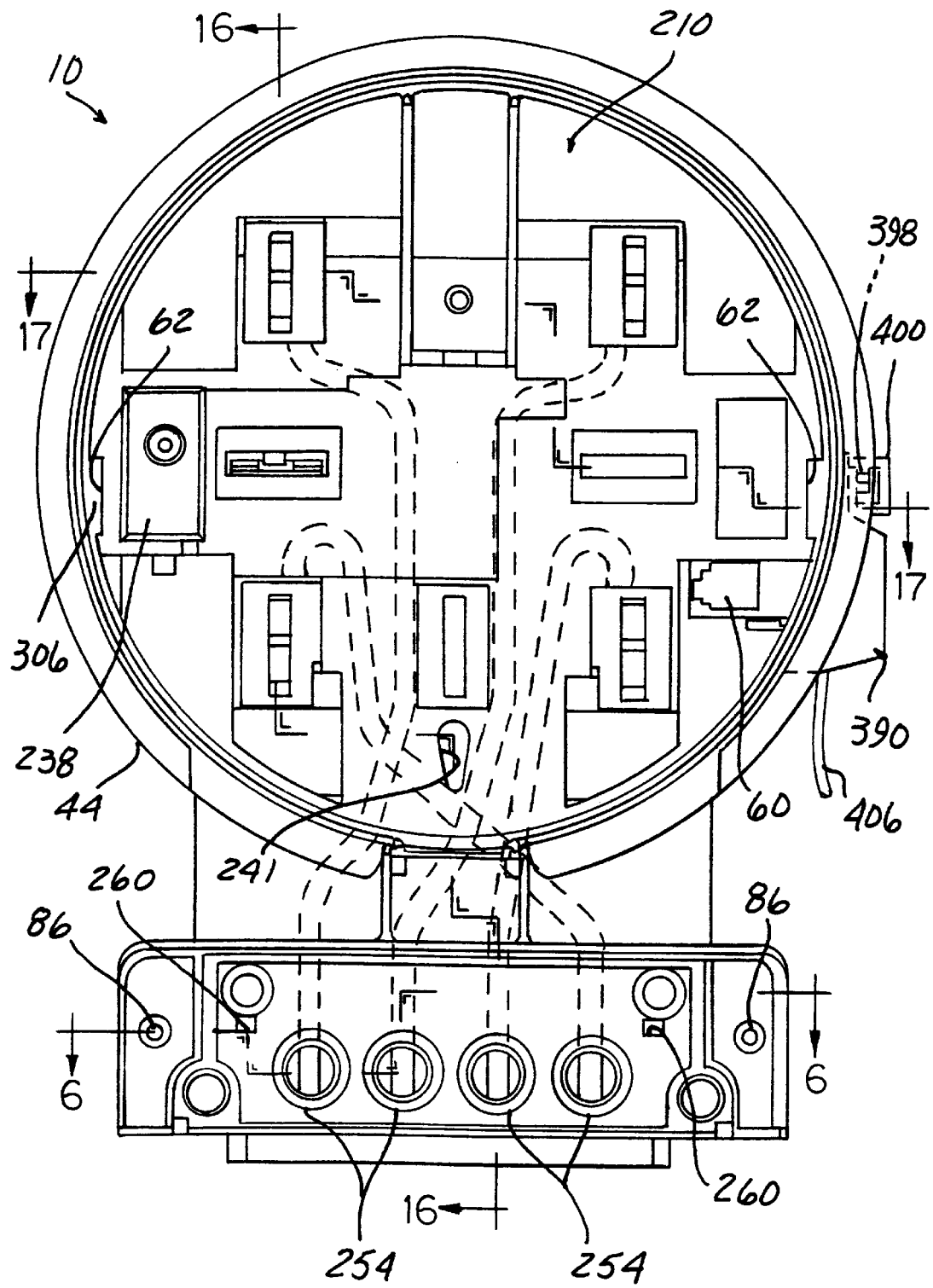
FIG. 3 is a front elevational view of an assembled watthour meter socket adapter according to the present invention.

As shown in FIGS. 1–3, the socket adapter 10 is formed of a housing consisting of a first or rear housing 30, a second or front housing 32, a surge ground conductor or frame 34, a terminal cover 36 and a plurality of interconnected jaw contacts, electrical conductors and terminals disposed between the rear and front housings 30 and 32, which are described in greater detail hereafter. The rear housing 30, the front housing 32 and the terminal cover 36 are formed of an electrically insulating material, such as a suitable plastic, such as, polycarbonate.

Figure 4:
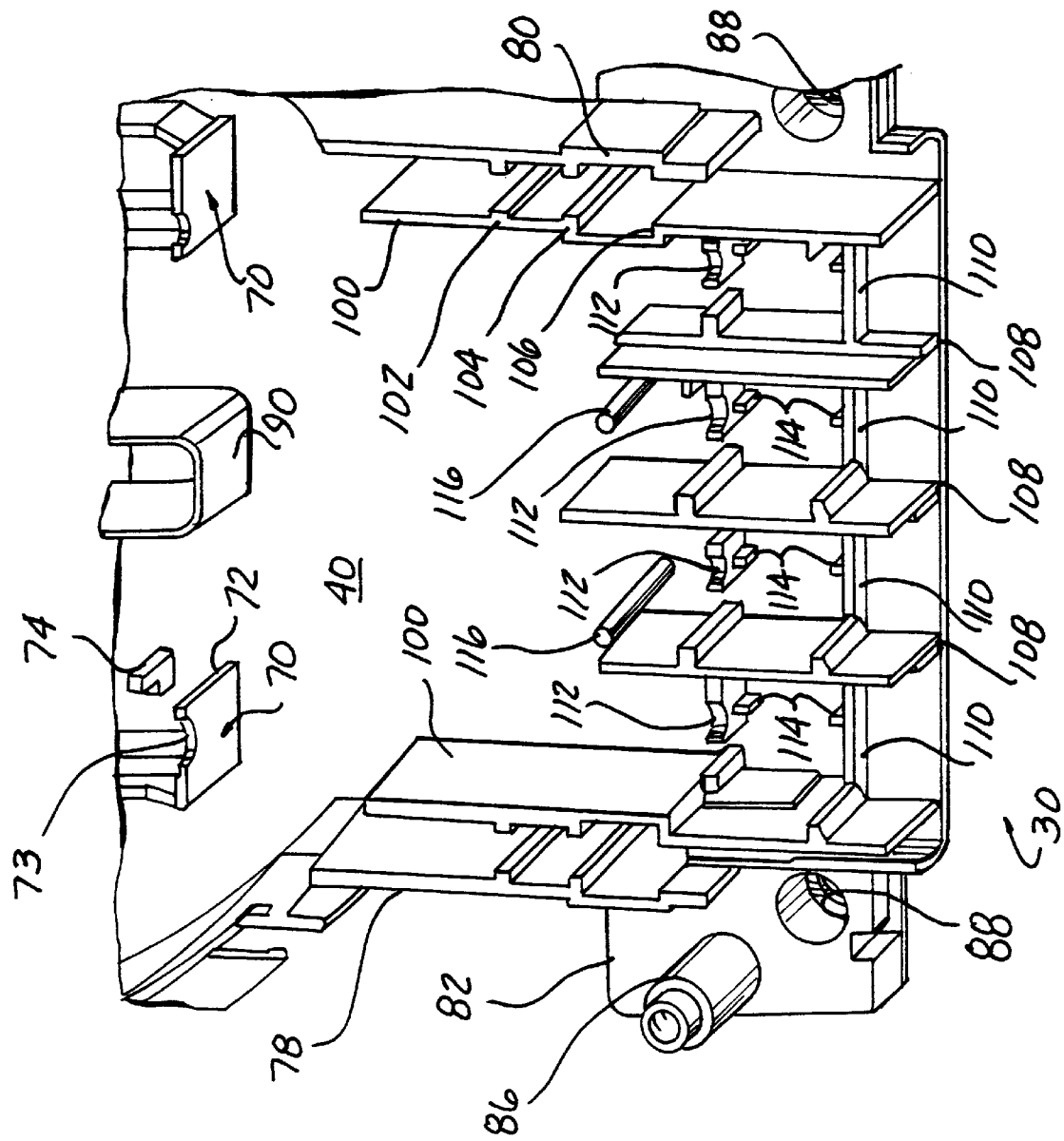
FIG. 4 is an enlarged, partial, perspective view of the terminal portion of the rear housing of the watthour meter socket adapter shown in FIG. 2.
Figure 5:
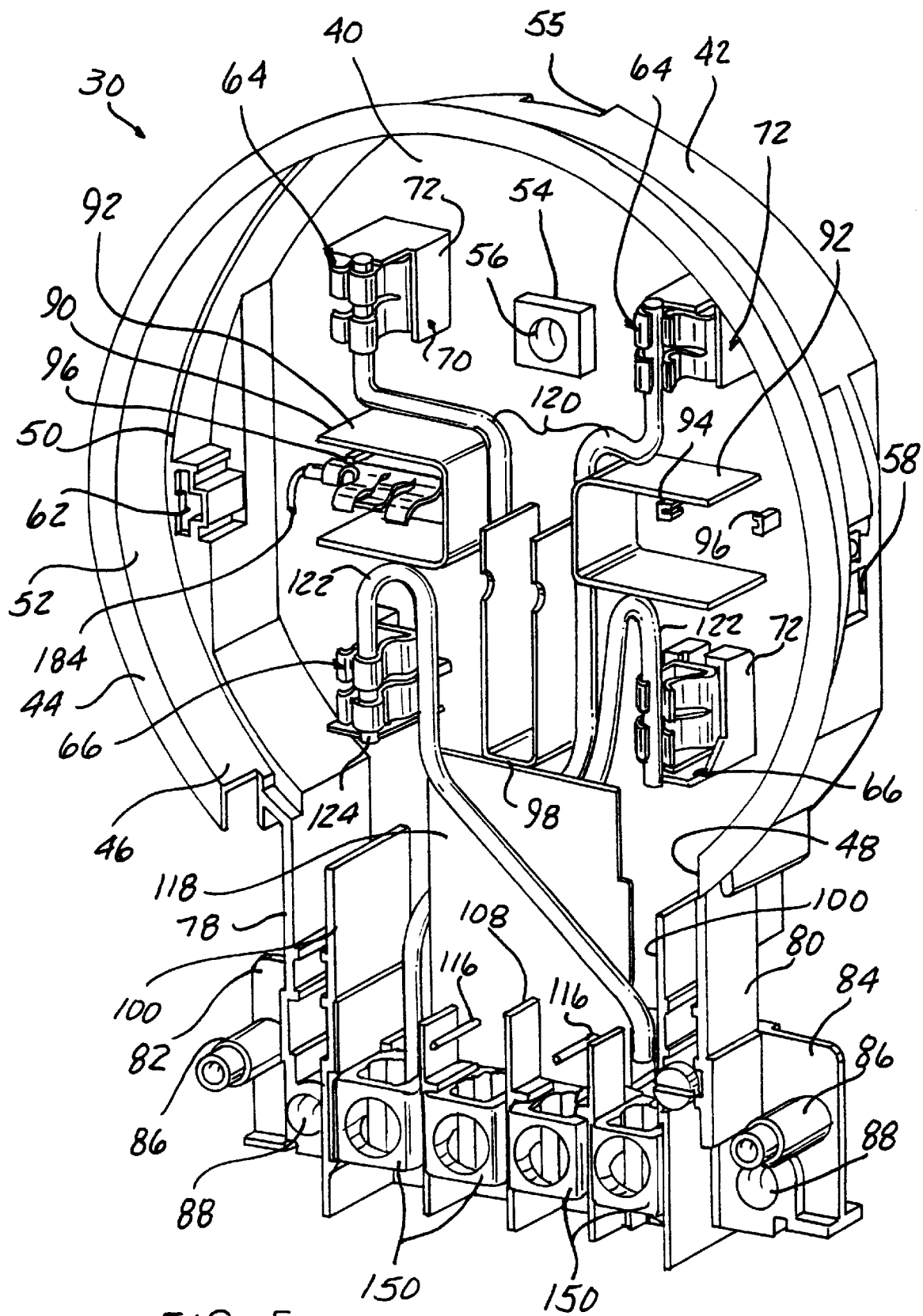
FIG. 5 is a perspective view of the entire rear housing showing the mounting of jaw contacts, electrical conductors and terminals therein.
Figure 6:
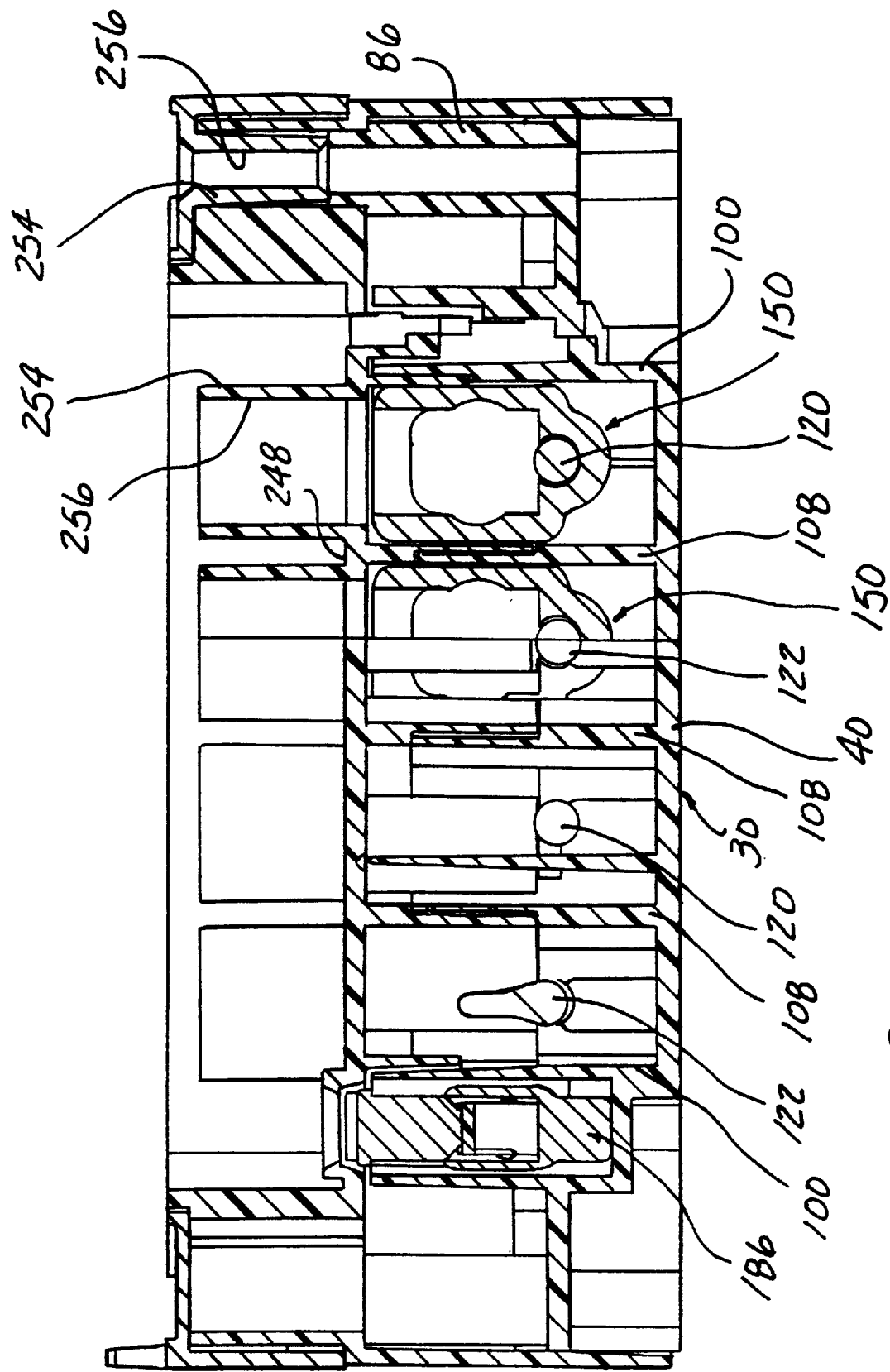
FIG. 6 is a cross-sectional view generally taken along line 6—6 in FIG. 3.

As shown in detail in FIGS. 4–6, the rear housing 30 has a central base or wall 40. The base 40 has a circular cross section defining a rear wall of the watthour meter receiving portion 24 of the socket adapter 10 and a co-planar, rectangular or square opposed end portion which defines the rear wall of the terminal portion 26. An annular side wall 42 extends outward from one surface of the base 40. The annular side wall 42 terminates in an outward radially extending mounting flange or rim 44. The side wall 42 and rim 44 include an annular discontinuity formed between two spaced ends 46 and 48 which extends over a predetermined angular extent of the side wall 42 adjacent to the terminal portion 26 of the socket adapter 10.

As shown in FIG. 5, a radially inward extending ledge 50 is formed in the inner surface of the side wall 42. An outer annular surface 52 is formed between the ledge 50 and the rim 44 which receives the ring portion of the surge ground frame 34, as described hereafter.

A generally square boss 54 is formed on the base 40 and has a central aperture 56 formed therein. The boss 54 forms part of a hanger assembly for the socket adapter 10, as described hereafter.

An aperture 58 having a generally square shape, for example, is formed in a flat 59 on the side wall 42. The aperture 58 is sized to receive a communications connector such as a telephone jack 60, shown in FIGS. 3 and 22 to provide communication through the socket adapter 10 for any purpose, such external automatic reading communication with the watthour meter 12. Alternately, a strain relief can be mounted in the side wall 42 to receive a communications conductor.

Figure 22:
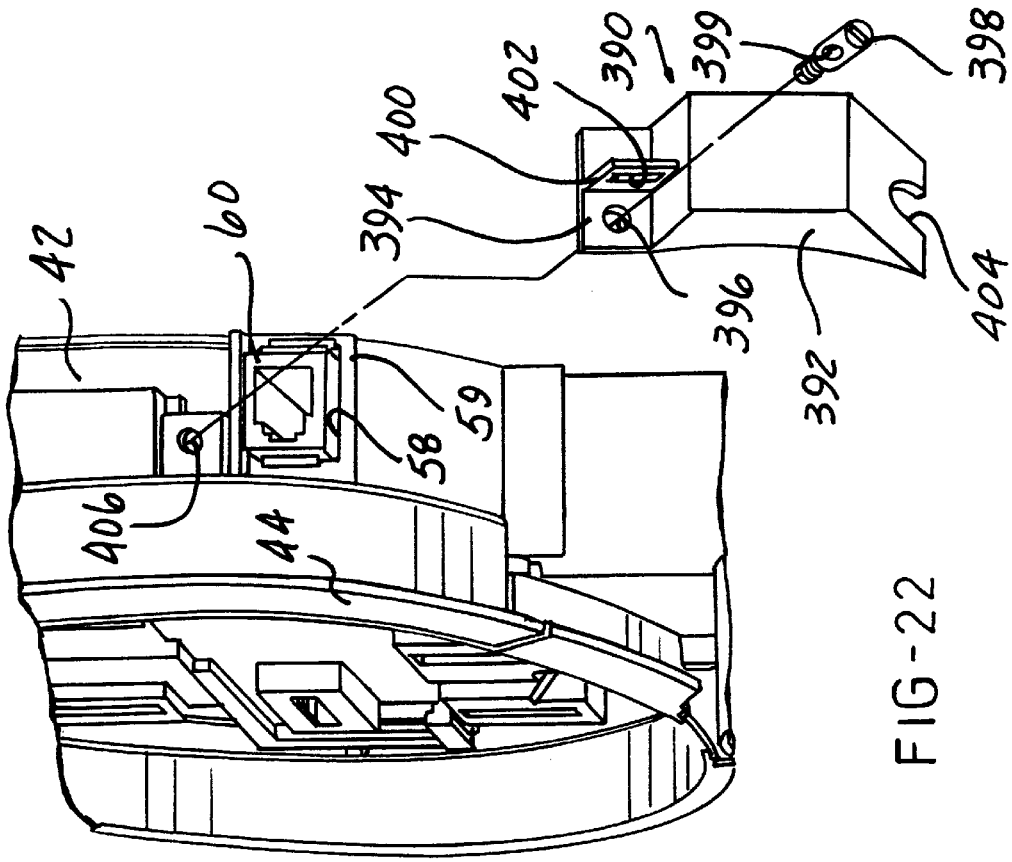
FIG. 22 is an exploded, perspective view of the communications connector cover.

As shown in FIGS. 3 and 22, a cover means denoted generally by reference number 390 is preferably removably mounted on the sidewall 42 of the rear housing 30 for sealingly covering the communications connector 60 mounted in the sidewall 42. The cover means 390 includes a five-sided housing or enclosure 392 having four sides, a closed outer end and an open inner end. A flange 394 projects from the housing 392. An aperture 396 is formed in the flange 394 for receiving a fastener 398 therethrough as described hereafter. A wire seal receiving flange 400 is also formed on the flange 394 and projects generally perpendicularly therefrom. A slot 402 is formed in the flange 400 for receiving a wire seal which is engagable through the slot 402 and an aperture 399 in the fastener 398 for securing the fastener 398 in place and to provide an indication of tampering with the socket adapter.

Another aperture 402 may be formed in any convenient location in the housing 392, such as along a bottom side wall, any of the other sidewalls or even the outer end wall for passage of the communications conductor 406 therethrough as shown in FIG. 3.

The aperture 396 in the flange 394 of the cover means 390 is alignable with an aperture 406 formed in the sidewall 42 of the rear housing 30. This enables the fastener 390 to project through the aligned apertures 394 and 406 to releasibly mount the cover means 390 on the sidewall 42 of the housing 30. In addition, the fastener 398 also engages mounting tabs on the surge ground frame 34 as described hereafter. The fastener 398 is capable of receiving an external ground connection or conductor thereby enabling the cover means 390 which may be formed of a suitable high-strength metal or even plastic, to be grounded along with the ground surge frame 34.

Further, at least one and preferably a pair of diametrically opposed apertures 62 are also formed in the base 40 for receiving mounting tabs on the surge ground frame 34 as described hereafter.

The single phase socket adapter 10 shown as an example in the present invention includes a pair of line jaws, conductors, and terminals, and a pair of load jaws, conductors and terminals. The pair of line jaw contacts, both denoted generally by reference number 64, as well as the pair of load jaw contacts both denoted by reference number 66, are freely supported within jaw contact frames denoted by reference number 70 in FIGS. 4 and 5. Each jaw contact frame 70 includes a plurality of flanges 72 arranged in a generally polygonal shape to freely support a jaw contact 64 or 66 therein without the use of additional fasteners. At least one side of each jaw contact frame 70 includes a boss 74 having an inner shoulder positioned to receive and support a bottom edge of a jaw contact 64 or 66.

One of the end flanges 72 of each jaw contact frame 70 is formed with a semi-circular recess 73 which receives one end of an electrical conductor to position the jaw contact and the electrical conductor in the jaw contact frame 70.

As shown in FIGS. 4 and 5, a pair of parallel side flanges 78 and 80 extend from approximately the ends 46 and 48 of the annular side wall 42 over the terminal portion 26 of the rear housing 30. A portion of the terminal portion 26 of the base 40 projects outward from the side flanges 78 and 80 formed of outer wall members 82 and 84. Each wall member 82 and 84 carries an elongated sleeve 86 having a central bore extending therethrough. The bore receives a fastener, not shown, to secure the rear housing 30 to the front housing 32 as described hereafter. An additional pair of apertures 88 are also formed in the wall members 82 and 84 and receive fasteners to secure the joined front and rear housings 30 and 32 to a wall or other support surface.

As shown in detail in FIG. 5, fifth and sixth potential jaw contacts 90, only one of which is shown, are also mounted on the base 40 and receive a potential blade terminal extending from the watthour meter 12, not shown. A pair of barriers 92 project from the base 40 to surround a portion, such as at least three sides, of a potential terminal 90 mounted therein. Pairs of mounting clips 94 and 96 are formed on the base 40 and disposed within the periphery of the barriers 92 and define mounting surfaces for the potential jaw contacts 90 to position the potential jaw contacts 90 within each barrier 92. An additional barrier 98 is also formed on the base 40 for receiving an optional ground terminal, not shown.

A plurality of parallel, spaced dividers are formed on the terminal portion of the base 40 to position terminals, described hereafter, on the base 40. The dividers include a pair of elongated, outer most disposed dividers 100, each of which are spaced from one of the side flanges 78 and 80 on the base 40. Each divider 100 and spaced side flange 78 and 80 defines a channel for receiving a potential terminal collar, described hereafter. As such, each divider 100 and side flange 78 and 80 is formed with a plurality of ribs 102, 104 and 106 form guides for receiving various portions of the potential terminal collar.

Three additional dividers, each denoted by reference number 108, also formed on the base 40 of the rear housing 30 and are disposed generally parallel to each other between the outermost dividers 100. Each divider 108 forms a channel with one of the outer dividers 100 or an adjacent divider 108 which receives a terminal collar mounted on one end of a conductor carrying a line or load jaw contact 64 and 66 at an opposite end.

An end wall 110 projects perpendicularly from the base 40 between adjacent dividers 108 and outer dividers 100. The end walls 110 support one side of the terminal collar as well as an external conductor extending into the terminal collar. An arcuate conductor guide 112 is formed on the base 40 between adjacent dividers 108 and/or 100 and is spaced from the end wall 110. The guide 112 supports one of the conductors in the rear housing 30. A pair of opposed ribs both denoted by reference numbers 114 project inwardly from each end wall 110 and the opposed conductor guide 112. The ribs 114 support a terminal, within, as described hereafter.

Finally, a pair of locating pins 116 project outwardly from the base 40 adjacent to the dividers 108. The locating pins 116 locate and support an electrically insulating pad 118 shown in FIG. 5, which is interposed between certain of the conductors and an overlaying or cross over conductor.

Figure 7:
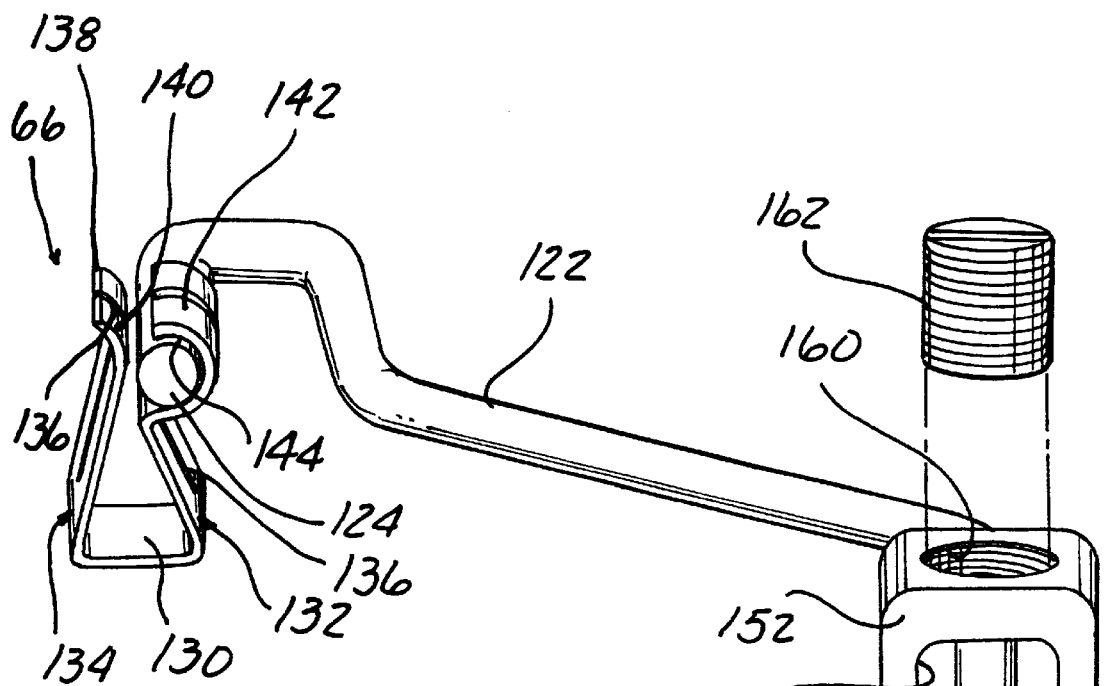
FIG. 7 is a perspective view of one embodiment of an electrical conductor, jaw contact and terminal employed in the watthour meter socket adapter shown in FIG. 5.
Figure 8:
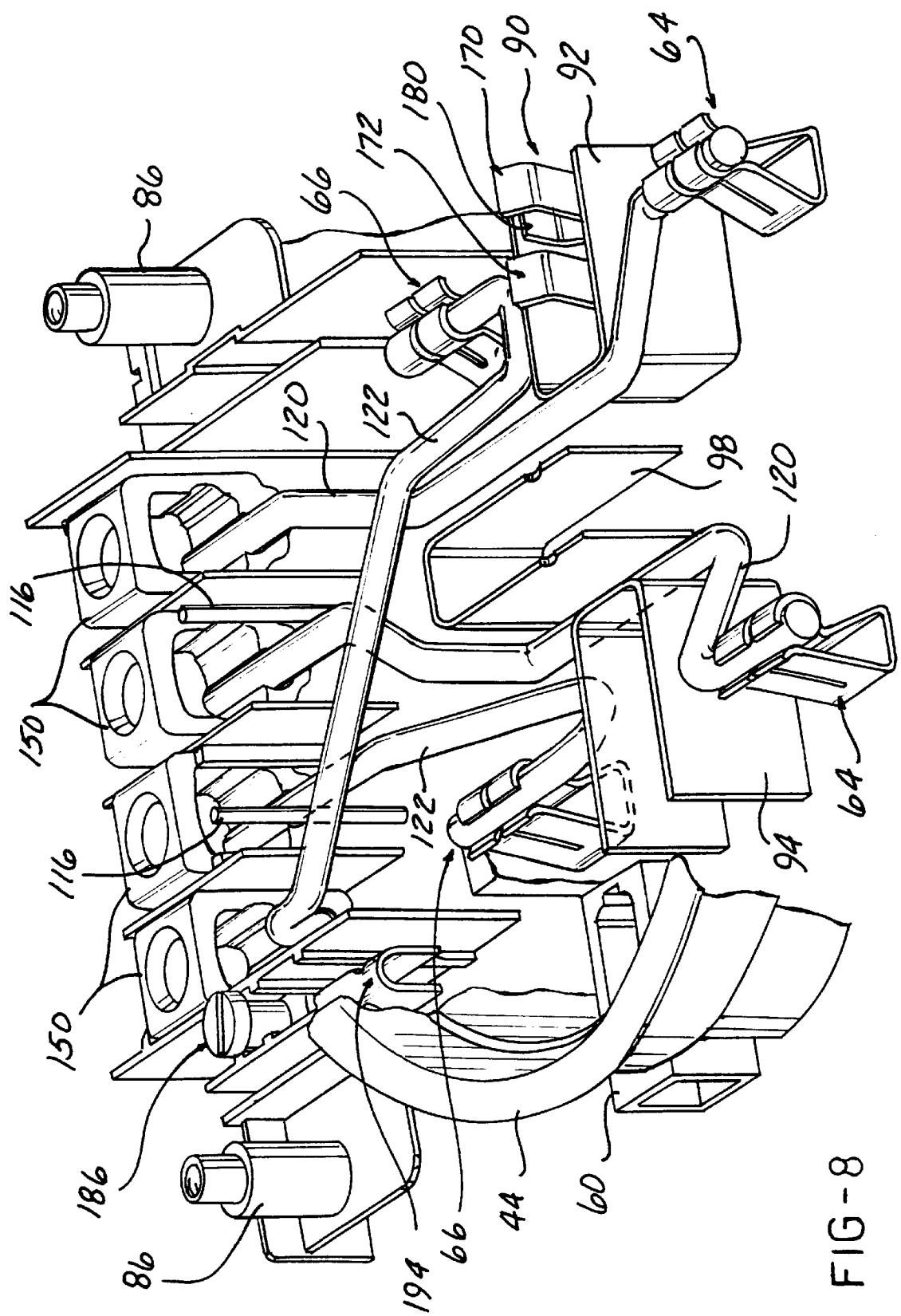
FIG. 8 is a partial, perspective view of the rear housing with the conductors, jaw contacts and terminals mounted therein as depicted in FIG. 5.

As shown in detail in FIGS. 5, 7 and 8, a plurality of electrical conductors are supported on the base 40 of the rear housing 30 and are located within an internal cavity formed between inside facing surfaces of the base 40 of the rear housing and the front housing 32.

In the exemplary single phase socket adapter 10 of the present invention, four electrical conductors are mounted on the base 40 and include a pair of line conductors 120 and a pair of load conductors 122. As the conductors 120 and 122 are identical, the following description of conductor 122 and its associated jaw contact and terminal will be understood to apply to all of the conductors 120 and 122 and their associated jaw contacts 64 and 66 and terminals.

Each of the conductors 120 and 122 is in the form of a rigid, solid conductive member. In this embodiment, the conductor 122 has a generally circular or round cross-section and is provided without any external insulation. However, it will be understood that the conductor 122 may have other cross-sectional shapes, such as polygonal, square, rectangular, etc. The conductor 122 has a first end 124 and then opposed second end 126.

Referring briefly to FIG. 5, there is shown an arrangement of the conductors 120 and 122 which provides suitable distance between the bare conductors 120 and 122 to prevent any flash or spark from passing between adjacent conductors 120 and 122. The two line conductors 120 and one of the load conductors 122 lay generally in the same plane. However, one load conductor 122 crosses over the other conductors 120 and 122 and is insulated therefrom by a separate insulator pad 118 which is interposed between the conductor 122 and the remaining conductors 120 and 122 as shown in FIG. 5.

One of the line or load jaw contacts 64, 66 is coupled to the first end 124 of each conductor, such as jaw contact 66 for the load conductor 122 shown in FIG. 7. The conductor 120 and 122 are formed or bent into a predetermined configuration so as to position the first end 124 thereof and the associated jaw contact 64 and 66 mounted thereon at the standard jaw contact positions in a watthour meter socket adapter as shown in FIG. 5.

Each jaw contact 64 and 66, such as jaw contact 66 as shown in FIG. 7, is formed of a one piece, unitary, conductive member having a base 130 from which a pair of opposed side legs 132 and 134 extend angularly inward toward spaced opposite ends. A slot 136 is preferably formed in each side leg 132 and 134 to divide each side leg 132 and 134 into a pair of contact fingers, each of which has the same shape. An end 138 of each contact finger of the side leg 134 extends angularly outward from a contact surface 140 and forms a terminal guide for receiving one of the blade terminals 18 on the watthour meter 12 into the jaw contact 66.

A second end 142 of the side leg 132 has an arcuate shaped concave, semi-circular recess 144. The recess 144 has an inner diameter approximate the outer diameter of the first end 124 of the conductor 122 to electrically couple the second end 142 of the side leg 132 and thereby the entire jaw contact 66 to the first end 124 of the conductor 122. The conductor 122 slides into the recess 144 in a freely movable manner without fasteners. However, a press fit or other securing methods or fasteners, such as a soldering, can be employed.

It should be noted, as shown in FIG. 7, that the first end 124 of the conductor 122 projects outward a short distance beyond a side edge of the second end 142 of the side leg 132 of the jaw contact 66. As shown in FIGS. 4 and 5, this outwardly projecting end overlays and seats in the recess 73 in the flange 72 of the jaw contact frame 70 carried on the base 40 of the rear housing 30. The recess 73 in the flange 72 supports the first end 124 of the conductor 122 above the base 40 in the desired position so as to enable the jaw contact 66 to be likewise supported in the desired position to receive a blade terminal 18 of the watthour meter 12.

A terminal 150 is slidably inserted over the second end 126 of each conductor, as shown in FIG. 7. Each terminal 150 is in the form of an elongated, block-like terminal collar having an upper portion 152 with a first bore 154 extending therethrough and a lower portion 156 with a second bore 158 extending therethrough. The first and second bores 154 and 158 are disposed in open communication with each other. At least one threaded aperture 160 is formed in and extends through the upper portion 152 of the terminal 150 into communication with the first bore 154. A fastener 162, such as a threaded screw, is threaded through the aperture 160 into engagement with one end of an external electrical conductor which is one of the electrical line or electrical load conductors connected to the socket adapter 10. The fastener 162 urges the external conductor into secure electrical contact with the second end 126 of the conductor 122 in the second bore 158.

The second bore 158 in the terminal 150 has a circular cross-section sized to releasibly receive the second end 126 of the circular conductor 122. The upper portion of the second bore 158 is open to enable an upper portion of the conductor 122 to extend therethrough for electrical contact with an external electrical conductor inserted into the first bore 154.

As described above, a pair of potential jaw contacts, conductors and terminals, only one of which is shown in FIG. 5, are disposed within the rear housing 30. The potential jaw contact 90, by way of example only and as shown in detail in FIGS. 9 and 10, has a three finger jaw contact design formed of first and second spaced, outer legs 170 and 172, each of which extends from a generally planar base 174. Each of the first and second legs 170 and 172 terminates in an angularly bent or extending end portion 176 and 178, respectively, both of which extend in the same direction to one side of the base 174. A third leg 180 is located intermediate the first and second legs 170 and 172 and likewise extends integrally from the base 174. An outer end 182 of the third leg 180 projects angularly from a lower portion of the third leg 180 to an opposite side of the base 174 then the outer ends 176 and 178 of the first and second legs 170 and 172. The first, second and third legs 170, 172 and 180 thus form a slot therebetween which is capable of receiving a potential blade terminal extending outward from the base of the watthour meter 12, not shown.

A wire crimp collar 182 formed of two angularly disposed, bendable flanges extends from one end of the base 174. The flanges of the collar 182 are bendable in registry with one end of an electrical conductor 184 to electrically connect the conductor 184 to the potential jaw contact 90. Alternately, solder may be used to connect the conductor 184 to the collar 182 or directly to the base 174.

Figure 9:
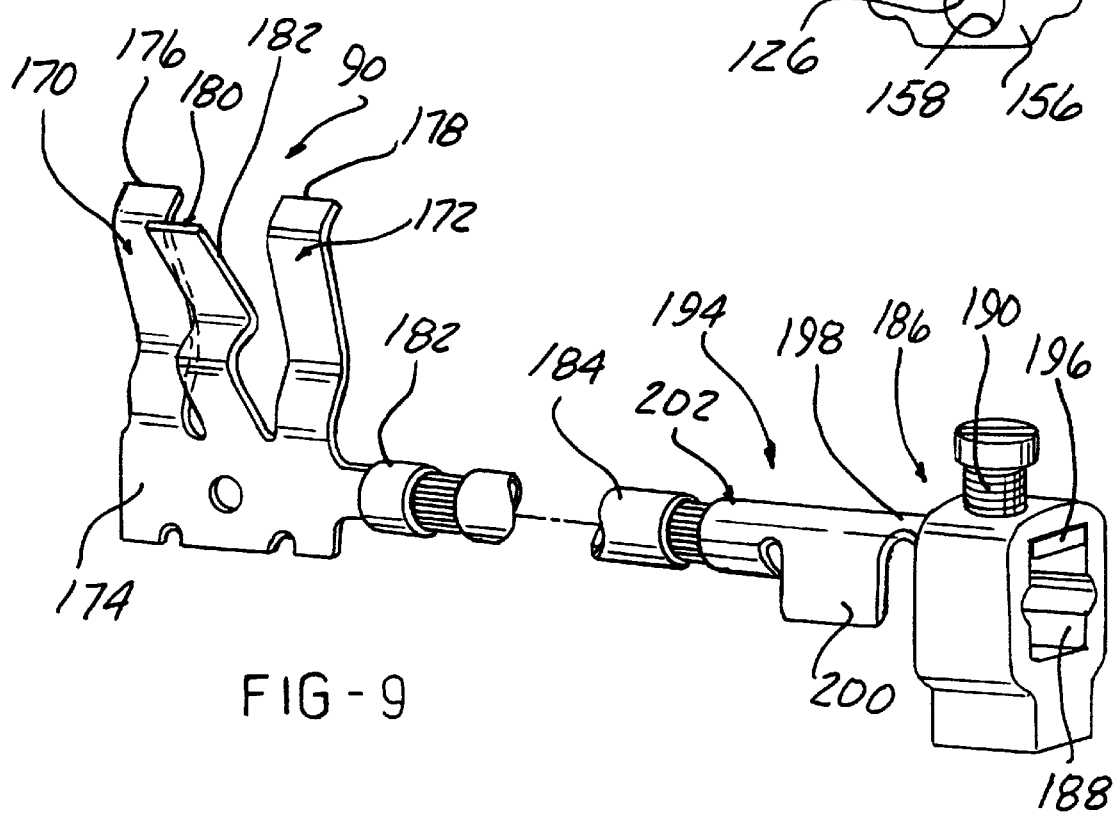
FIG. 9 is a perspective view of the potential jaw contact, terminal clip and terminal shown in FIGS. 3 and 5.

FIG. 9 depicts a terminal collar 186 for the potential jaw contact 90. The terminal collar 186 is similar to the terminals 150 except that it includes only a single bore 188 extending therethrough. A threaded aperture in an upper portion of the potential terminal collar 186 receives a threaded fastener 190 which extends through the aperture into the first bore 188.

A terminal clip 194 connects the conductor 184 to the terminal collar 186. The terminal clip 194 has a planar or slightly curved first end 196 which is sized for slidable insertion into the bore 188 in the terminal collar 186. The first end 196 is engaged by the screw fastener 190 as described hereafter. An intermediate portion 198 extends linearly from the first end 196. At least one and preferably a pair of tabs 200 extend generally perpendicularly from the intermediate portion 198.

A second end portion 202 extends linearly from the intermediate portion 198 and includes a second pair of tabs which are bendable about one end of the conductor 184 to crimp the conductor 184 into electrical engagement with the terminal clip 194. Solder may also be used to affixedly enjoin the bare end of the conductor 184 to the tabs 202.

Figure 10:
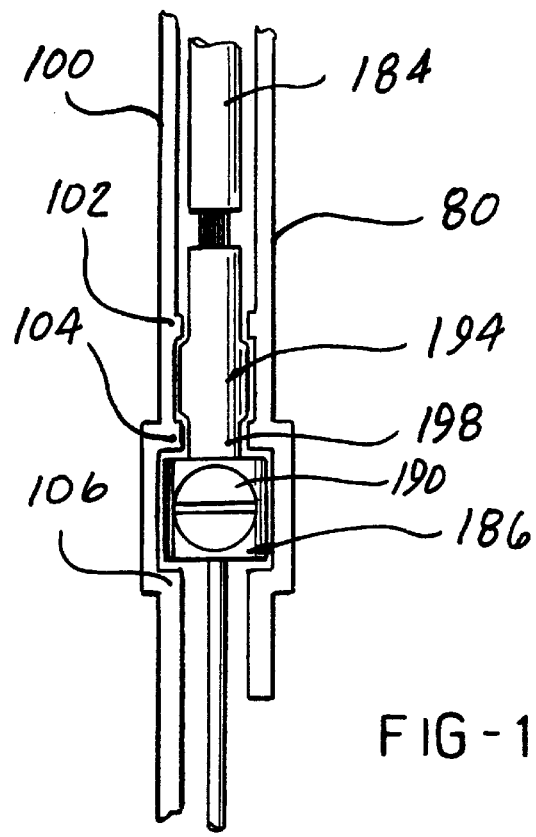
FIG. 10 is an enlarged, plan view showing the mounting of the terminal clip and terminal collar of FIG. 9 in pockets on the rear housing of the watthour meter socket adapter.

As shown in FIGS. 4, 5 and 10, the terminal clip 194 is slidably positioned between the opposed pairs of ribs 102, 104 and 106 formed in the divider 100 and side flange 78 or 80 on the base 40 to longitudinally position the terminal clip 194 and terminal 186 in the terminal portion 26 of the socket adapter 10. However, the terminal clip 194 and the end of the conductor 184 connected thereto is slidably moveable within the first bore 188 in the terminal 186 via the threading extension or retraction of the fastener 190 relative to the terminal collar 186. With the screw fastener 190 fully retracted out of the aperture in the top of the terminal collar 186, the terminal collar 186 will be forced downward toward the base 40. This causes the first end 196 of the terminal clip 194 to be disposed in an upper portion of the first bore 188 of the terminal collar 186 and forms an opening in the lower portion of the bore 188 for receiving an external conductor therein. With one end of the external conductor disposed in the bore 188 between a lower surface of the terminal collar 186 and the first end 196 of the terminal clip 194, the screw fastener 190 is threaded into the terminal collar 186. However, since the terminal clip 194 is held in relative position with respect to the base 40, such threading engagement of the screw fastener 190 causes the terminal collar 186 to move upward relative to the base 40 until the first end 196 of the terminal clip 194 securely engages the end of the external conductor in the bore 188 to secure the external conductor in the terminal collar 186 in electrical contact with the terminal clip 194 and the conductor 186 connected thereto.

As shown in FIGS. 2 and 3, and in greater detail in FIGS. 6, and 11–17, the front housing 32 includes a generally planar wall or base 210, an arcuate edge 212, a filler 214 and a terminal portion 260, all of which are preferably integrally formed as a one piece member.

The wall or base 210 includes a plurality of bosses 218 located at the standard jaw contact positions of a watthour meter socket adapter. The top surface of each boss 218 extends a short distance above the front surface of the wall 210. A slot 220 is formed in each boss 218 and sized for receiving a blade terminal 18 of the watthour meter 12 therethrough, as described hereafter. The bosses 218 form recesses or receptacles the back surface of the wall 210, each denoted by reference number 222 in FIGS. 10–12. The recesses 222 will be described in greater detail hereafter.

A pair of side walls 224 project from opposite sides of the wall 210 and are positioned to be disposed adjacent to internal side edges below the ledge 50 in the rear housing 30 on the base 40. A pair of recesses 226 are formed in the wall 210 adjacent the arcuate edge 218 to provide space for the meter feet on the watthour meter 12 when the watthour meter 12 is mounted in the socket adapter 10.

A cut-out 230 for mounting the surge ground frame 34 to a mount used to attach the socket adapter 10 to a support surface, is formed in an upper end of the wall 210. The cut-out 230 defines a cavity which terminates in a cut-out edge 232 on the back surface of the wall 210.

Finally, a pair of switch frames 234 extend outward from opposite sides of the wall 210 generally adjacent the slots 220 for the fifth and sixth jaw contacts. The switch frames 234 each include an aperture 236 for mounting a switch 238 therein, as shown in FIGS. 2 and 3. The switch 238 has a moveable actuator which extends outward from the switch body to a position engageable by the base of the watthour meter 12 when the watthour meter 12 is mounted in the socket adapter 10.

The watthour meter 12 depresses the actuator of the switch 238 to switch internal switch contact(s).

The switch can be employed as part of a theft deterrent or detection system as it is capable of generating a signal when the watthour meter 12 is removed from the socket adapter 10. This signal can be provided to external theft detection equipment or monitors to alert the utility that the watthour meter 12 is being unauthorizedly removed from the socket adapter 10.

Alternately, the switch 238 can be connected by conductors, not shown, between the line and load connections of each phase of a current transformer, also not shown. In this manner, when the watthour meter 12 is removed from the socket adapter 10, the internal contacts of the switch 238 open to place the line and load connections of the current transformer in an open condition.

Figure 11:
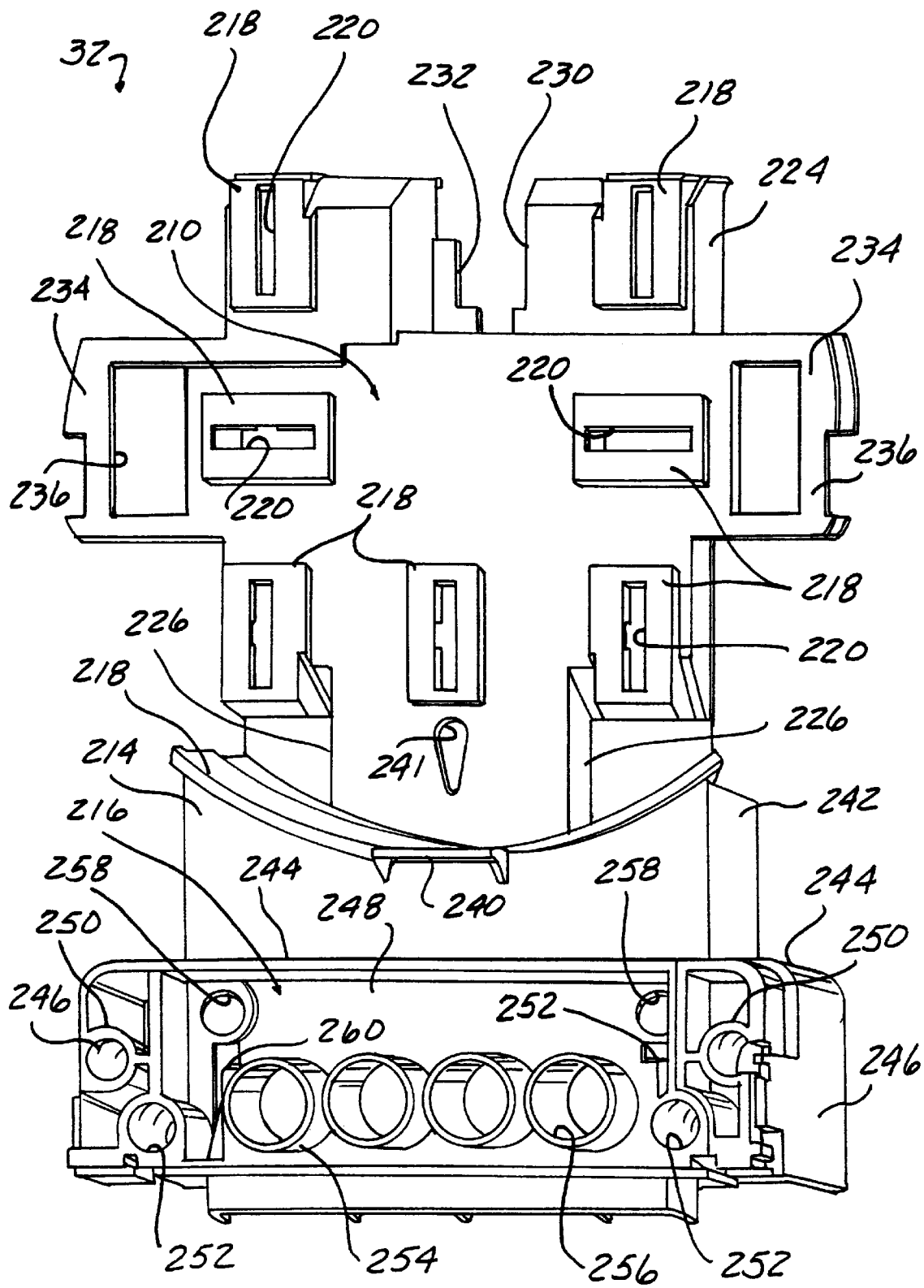
FIG. 11 is a perspective view of the front surface of the front housing of the watthour meter socket adapter shown in FIG. 2.
Figure 19:
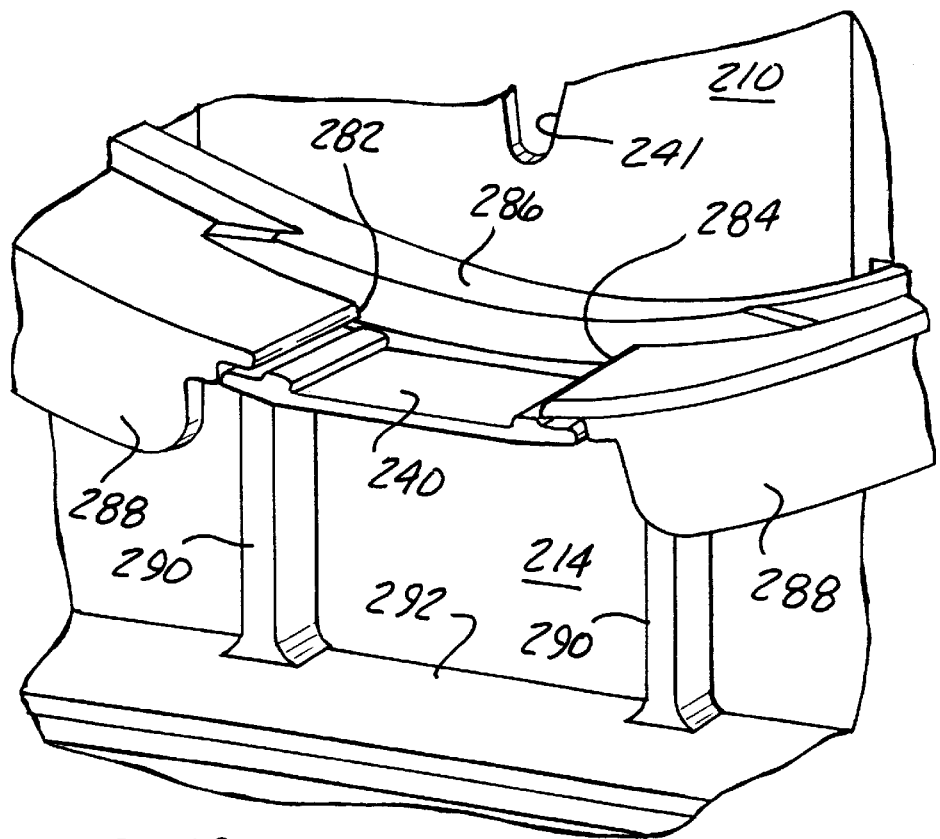
FIG. 19 is an enlarged, partial, perspective view of the central portion of the surge ground frame and a rim filler depicted generally in FIGS. 1 and 3.
Figure 15:
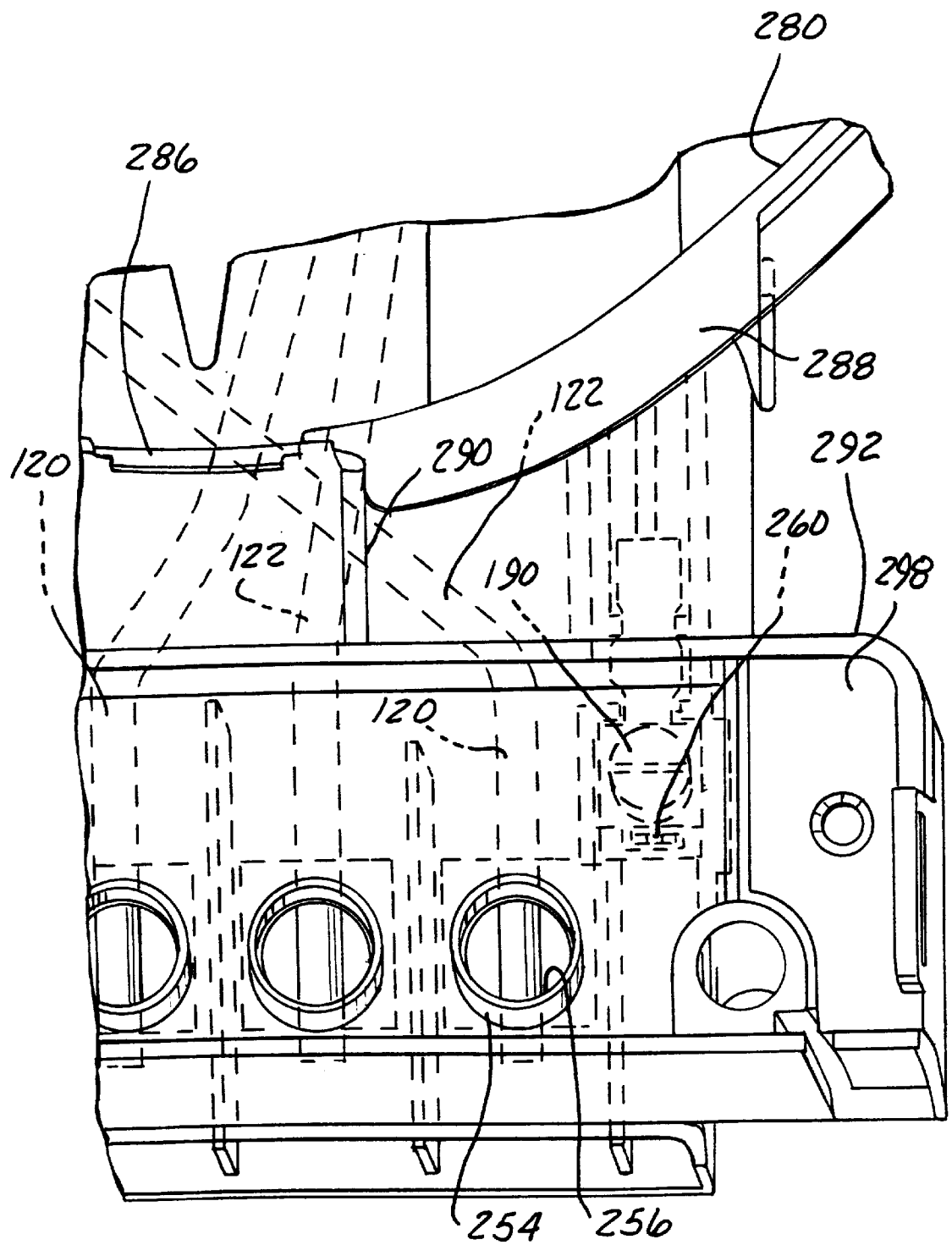
FIG. 15 is an enlarged, partial, perspective view of the bottom right portion of the assembled watthour meter socket adapter depicted in FIG. 3.

The filler 214 extends between the arcuate edge 218 and the terminal portion 216. The filler 214 has a front wall on which a break away rim filler 240, shown in FIGS. 11 and 19, is mounted. The function of the rim filler 240 will be described in greater detail hereafter in conjunction with the surge ground frame. A pair of side walls 242 extend from opposite sides of the front wall of the filler 214 to and overlap the outer surfaces of the side flanges 78 and 80 on the rear housing 30.

The terminal portion 216 includes a pair of opposed top edges 244 which project outward from the side flanges 242 of the filler 214 and terminate in depending side walls 246. A front wall 248 is interposed between the top edges 214 and the side walls 246. Ribs extend from the side walls 246, the front wall 248 and the top edges 244 to support a first pair of cylindrical sleeves 250. Each cylindrical sleeve 250 has a hollow bore extending therethrough which receives one end of the bosses 86 on the rear housing 80 as shown in FIG. 6. A second pair of cylindrical sleeves 252 are formed in the terminal portion 216 and are alignable with the bores 88 in the rear housing 30.

Figure 16:
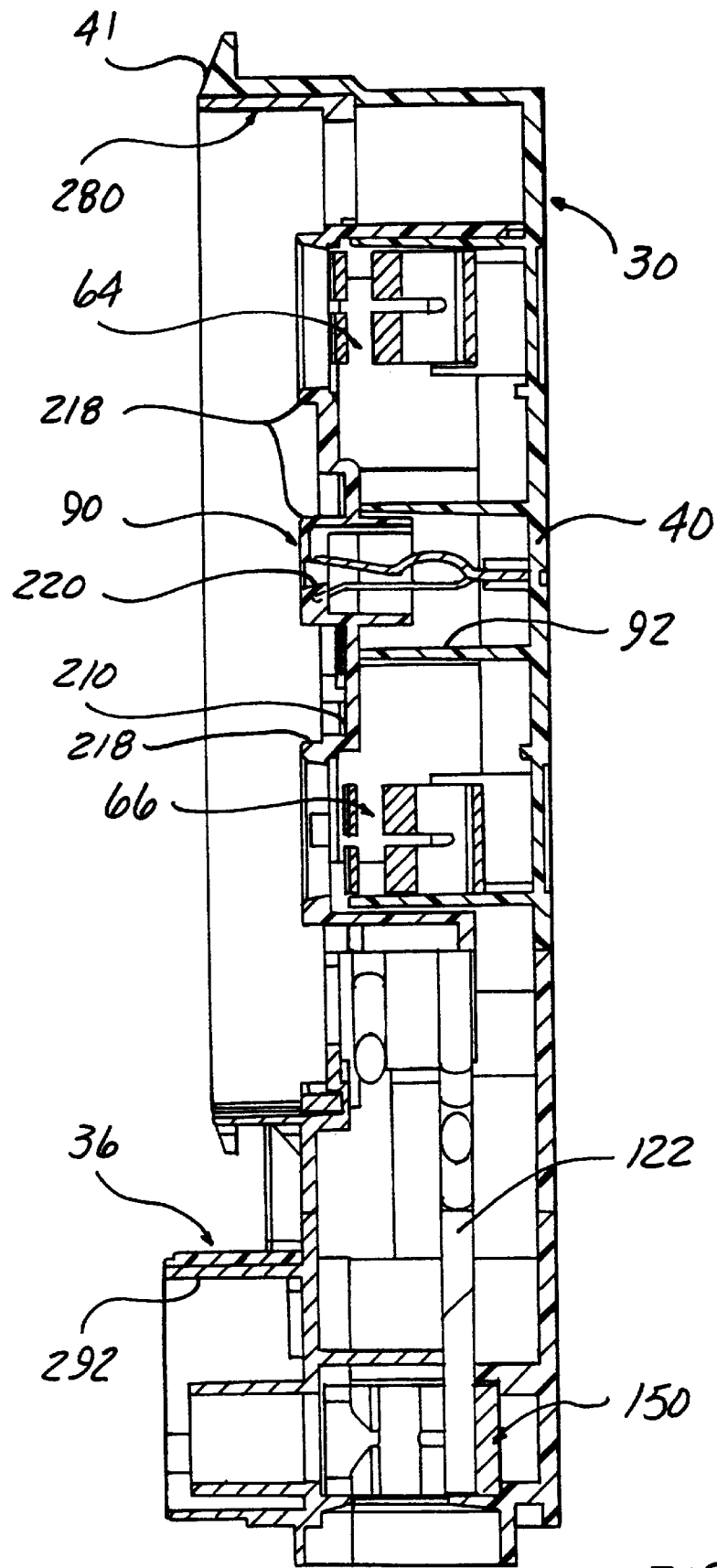
FIG. 16 is a cross-sectional view, generally taken along line 16—16 in FIG. 3.
Figure 17:
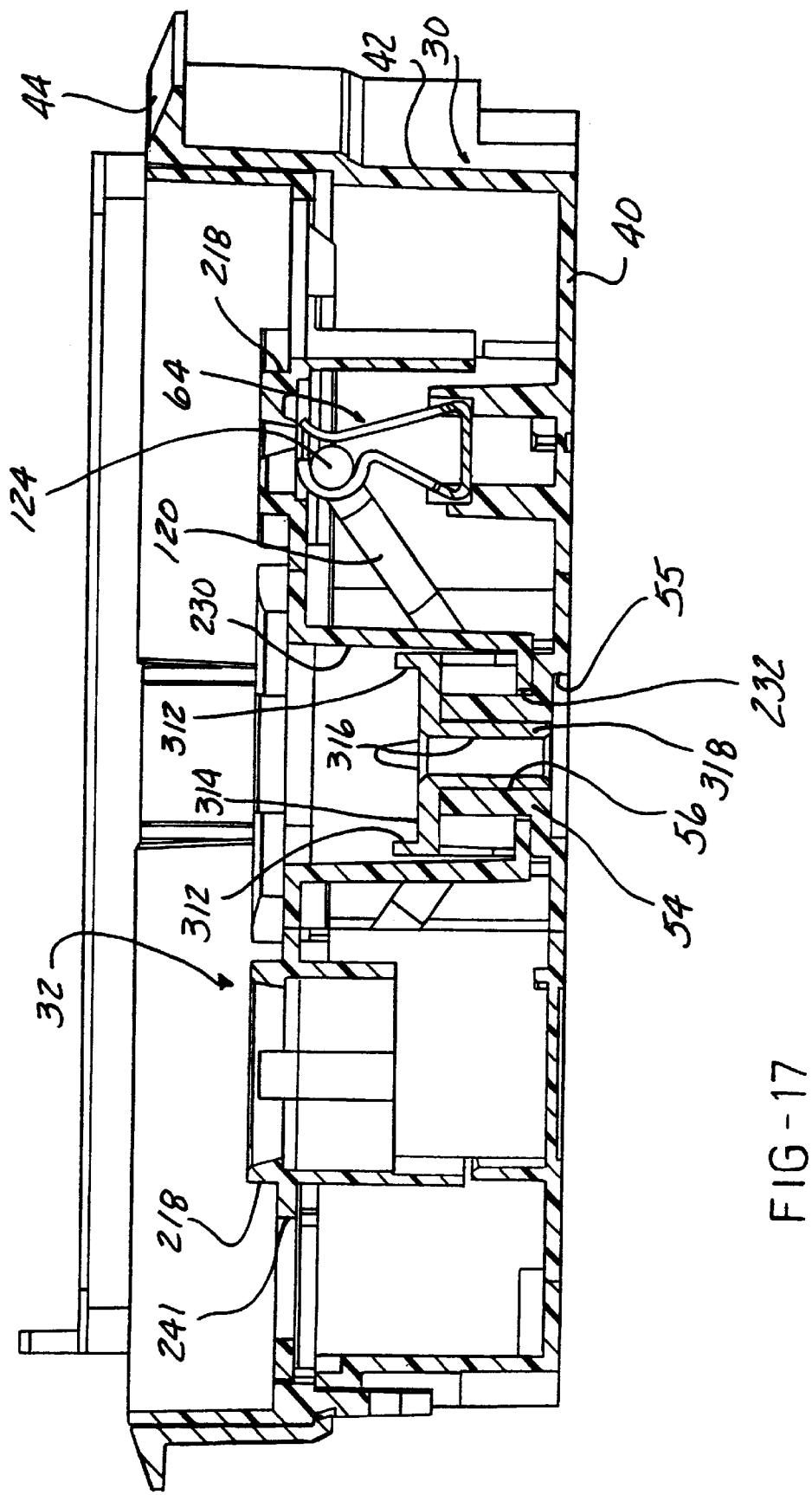
FIG. 17 is a cross-sectional view, generally taken along line 17—17 in FIG. 3.

A plurality of linearly arranged bosses 254 project outward from the front wall 248. Each boss has a hollow bore 254 which opens to the internal cavity between the front housing 32 and the rear housing 30 and generally overlays one of the terminals 150 as shown in FIGS. 6 and 16.

Figure 12:
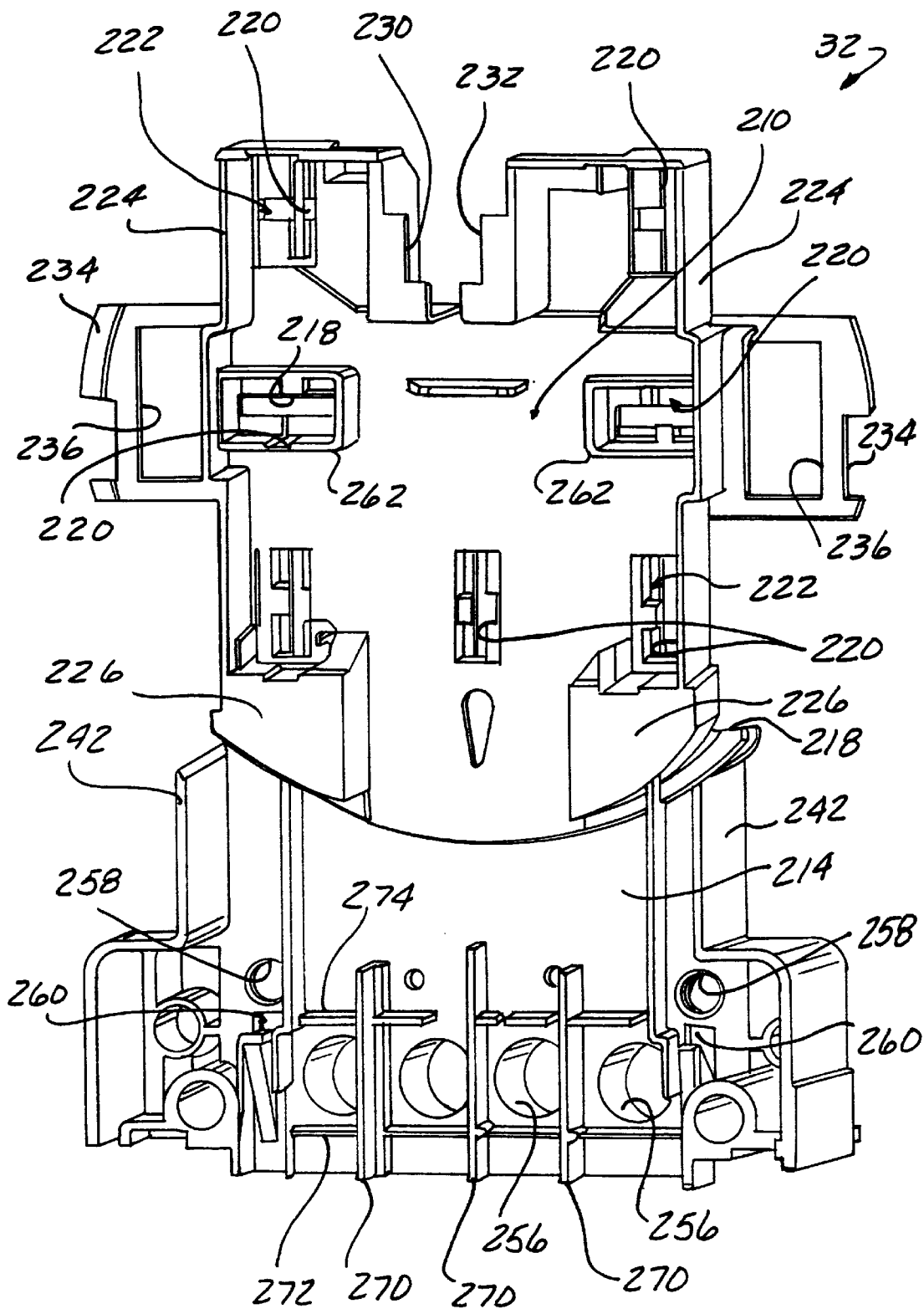
FIG. 12 is a perspective view of the rear surface of the front housing of the watthour meter socket adapter shown in FIG. 2.

An additional pair of apertures 258 are formed in the front wall 248 adjacent one edge of the filler 214. The apertures 258 overlay the potential terminal collars 186 to allow access to the screw fasteners 190 mounted therein. As shown in FIGS. 11 and 12, a smaller aperture or window 260 is formed in the front wall immediately below each aperture 258. The aperture or windows 260 allow a visible indication of the passage of an external conductor behind the terminal portion 216 of the front housing 32 into the terminal collar 186 disposed below the aperture 258.

Referring now to FIG. 12, there is depicted a rear surface of the front housing 32. As shown therein, an upstanding barrier 262 extends from the rear surface of the front housing 32 about the recessed 222 associated with the fifth and sixth jaw contacts of a standard watthour meter socket adapter. The barriers 260 to provide electrical insulation between the potential jaw contacts housed therein and the higher voltage carrying jaw contacts disposed in the adjacent recesses 222.

Figure 13:
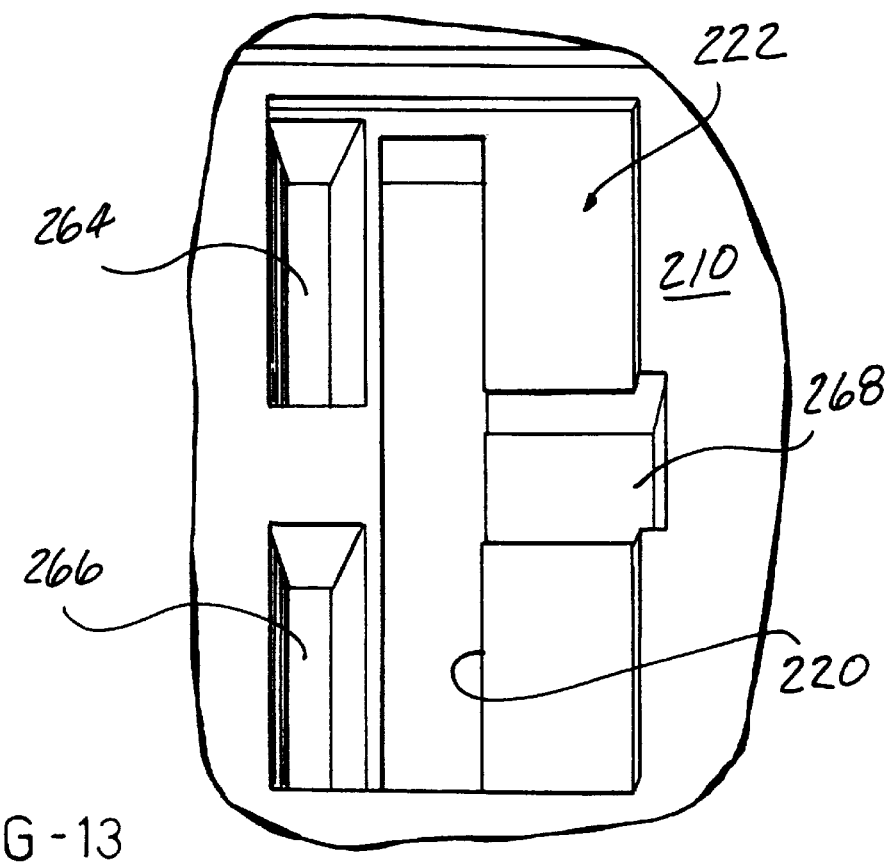
FIG. 13 is an enlarged partial view of the jaw contact recesses on the rear surface of the front housing of the watthour meter socket adapter.
Figure 14:
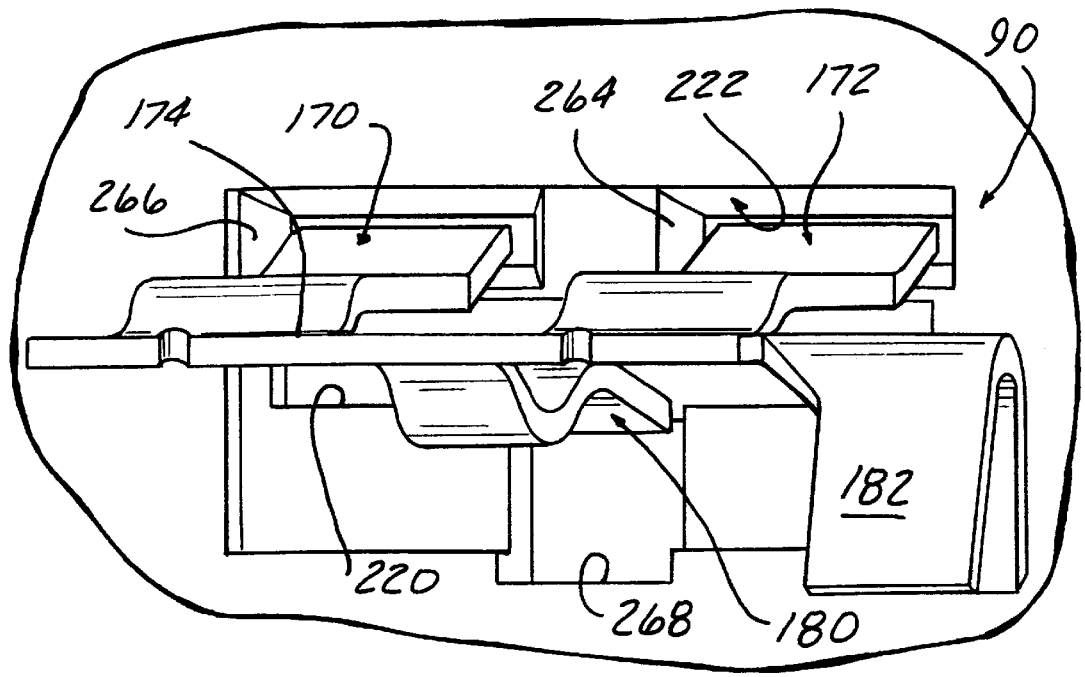
FIG. 14 is an enlarged, perspective view, similar to FIG. 13, but showing the mounting of the fingers of a potential jaw contact therein.

As shown in FIGS. 12–14, each recess 222 includes first and second pockets 264 and 266 which are spaced apart along one side edge of the recess 222. A third pocket 268 is formed along an opposite edge of the recess 222 and disposed centrally between the first and second pockets 264 and 266. When one of the three finger potential jaw contacts 90 is mounted in the recesses 222 at the fifth and sixth jaw contact positions, the first and second fingers 170 and 172 are affixedly disposed within the first and second pockets 266 and 264, respectfully. The upper ends of each of the first and second legs 170 and 172 engage an inner surface of each pocket 266 and 264. However, the third leg 180 is shorter in height then the first and second legs 170 and 172. This enables the upper edge of the third leg 180 to freely move within the third pocket 268 so as to enable a blade terminal of a watthour meter to be inserted between the third leg 180 and the aligned first and second legs 170 and 172.

The same recesses 222 are provided at the other jaw contact positions on the front housing 32. However, the line and load jaw contacts 64 and 66 have a generally shorter height than any of the legs of the three finger potential jaw contacts 90 such that the outer ends of the side legs of the jaw contacts 64 and 66 are spaced from the inner surfaces of the front housing 32 and merely lie within the recess 222 without contacting any portion of the wall 210 of the front housing 32.

Referring again to FIG. 12, a plurality of generally parallel dividers 270 are formed on the rear surface of the terminal portion 216 of the front housing 32. The dividers 270 are disposed between the bores 256 extending through the bosses 254 to form an electrically insulating barrier between the terminals mounted therebetween. The dividers 270 overlay the dividers 110 in the rear housing 30 when the front housing 32 is joined to the rear housing 30. Opposed end walls 272 and depending flanges 274 are also formed on the front housing 32 to overlay similarly formed end walls 110 and wire guides 112 on the rear housing 30.

Figure 18:
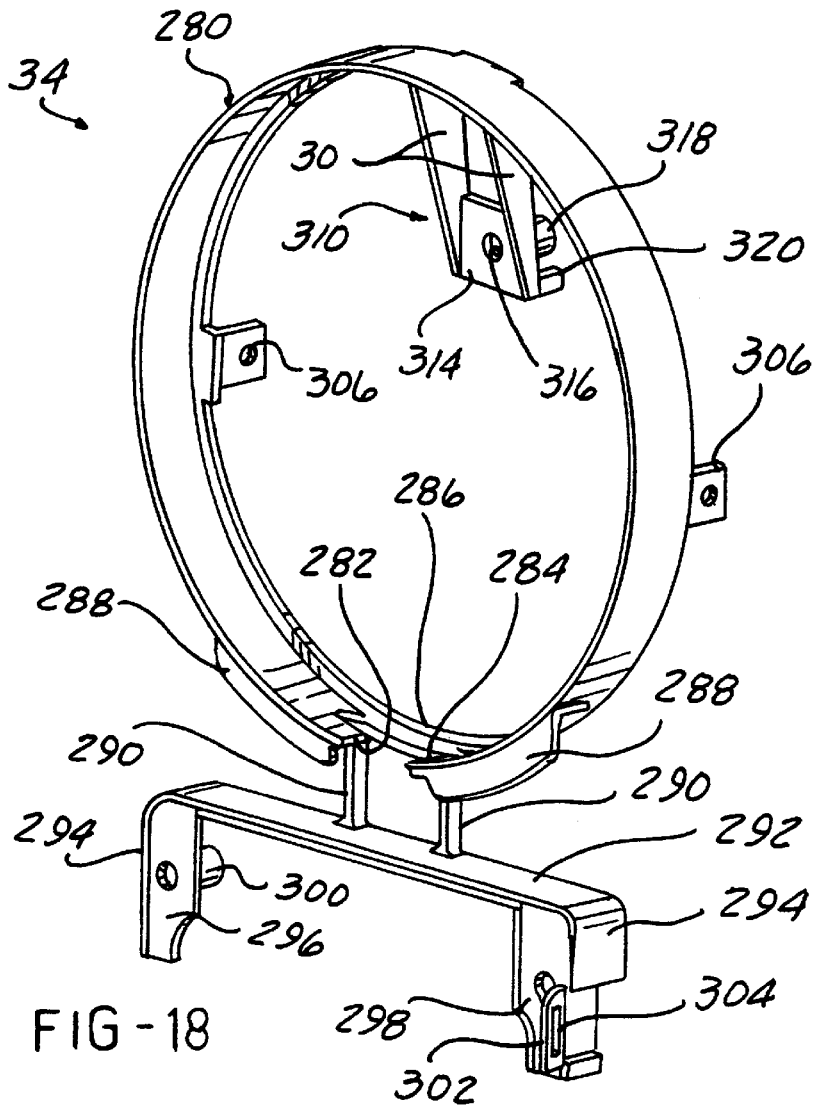
FIG. 18 is a perspective view of the surge ground frame shown in FIG. 1.

FIG. 18 depicts the detailed construction of the surge ground frame 34. The surge ground frame 34 includes an annular ring 280 having a width sized to fit within the annular surface 52 in the rear housing 30. The ring 280 has a constant width over substantially its entire diameter except for an annular discontinuity formed by opposed edges 282 and 284 at a position corresponding to the annular discontinuity in the side wall 42 of the rear housing 30 between the ends 46 and 48 of the side wall 42. A thin, continuous, arcuate portion 286 extends on an inner edge of the ring 280 to maintain the ring 280 in the desired annular form. Depending lips 288 extend from an outer edge of the ring 280 generally perpendicularly at a position adjacent to the ends 282 and 284.

A pair of connecting ribs 290 extend from the ring 280 adjacent to the ends 282 and 284 to a top wall 292 of a terminal frame. A pair of side legs 294 depend from the top wall 292. A cover plate 296 and 298 is positioned in each corner of the terminal frame adjacent an edge of the top wall 292 and each side leg 294. A hollow sleeve 300 projects rearwardly from each cover plate 296 and 298. An aperture is formed in each cover plate 296 and 298 in communication with the hollow bore in the sleeve 300 for receiving a fastener therethrough as described hereafter.

A flange 302 projects perpendicularly from the side leg 294 forwardly of the cover plate 298. An aperture 304 is formed in the flange 302.

A pair of locating tabs 306 project perpendicularly from diametrically opposed edges of the ring 280 and are slidably insertable into the apertures 62 formed adjacent the ledge 50 in the rear housing 30, as shown in FIG. 5.

A hangar denoted generally by reference number 310 is integrally formed with and projects from a top portion of the ring 280. The hangar 310 includes a pair of spaced arms 312 integrally extending from the ring 280. A square pad 314 is mounted between the ends of the arms 312 and has an aperture 316 opening to a hollow sleeve 318 projecting rearwardly of the pad 314. At least one and preferably a pair of locator pins 320 also project rearwardly from an end of each arm 312.

In assembling the watthour meter socket adapter 10, the conductors 120 and 122, all of the jaw contacts 64, 66 and 90, and the terminals 150 and 186 are mounted in their above-described positions within the rear housing 30. The front housing 32 is then mounted onto the rear housing 30 by inserting the wall 210 into the interior of the rear housing 30 until the outer most edges of the front housing 32 seat on the ledge 50 in the rear housing 30. During this mounting operation, the sleeves 250 in the front housing 32 are aligned with and slide over the end portion of the sleeves 86 in the rear housing 30. At the same time, the bores 254 in the front housing are aligned with the bores 88 and the rear housing 30.

The surge ground frame 34 is then inserted into the rear housing 30 with the tabs 306 sliding into the aperture 62 in the rear housing 30. Simultaneously, the boss 318 on the hangar pad 314 fits within the cutout 232 in the front housing 32 and slides into the bore 54 in the hangar pad 54 on the base 40 of the rear housing 30. The locator pins 320 on the hanger 310 engage an end portion of the cut-out edge 232 in the front housing 32. In this mounting position, the sleeves 300 on the terminal frame are aligned with the bores 86 on the rear housing 30.

The watthour meter socket adapter 10 is then mounted on a bottom connected meter socket with the conductors of the meter socket, not shown, inserted into each of the terminals 150. The fasteners 162 associated with each terminal 150 are then tightened to securely interconnect the conductors 120 and 122 in the socket adapter 10 with the conductors in the meter socket. Similar connections are made via the potential terminals 186 and potential conductors 184 extending from potential jaw contacts 90. A threaded fastener is inserted from the rear surface of the rear housing 30 through metal inserts in the sleeves 86, through the bores 250 in the front housing 32 and into the sleeves 300 in the surge ground frame 34 to affixedly interconnect the rear housing 30, the front housing 32 and the surge ground frame 34. Additional fasteners are inserted from the front of the socket adapter 10 through the aperture 316 in the hangar pad 314 and the bore 56 and the hangar pad 54 in the rear housing 32 into engagement with support member, not shown, slidably inserted into a slot 55 formed in the rear surface of the base 40 of the rear housing 30 as shown in FIG. 5. This fastener likewise joins the rear housing 30, the front housing 32 and the hangar 310 on the surge ground frame 34.

Next, the terminal cover 36 is inserted over the terminal portion 26 of the socket adapter 10 by inserting an internal flange 326, shown in FIG. 1, located along one side edge of the terminal cover 36 into a notch, not shown, formed between an edge of one side wall 246 of the front housing 32 and a spaced edge of a side leg 294 of the surge ground frame 94. An aperture 328 located adjacent an opposite side edge of the terminal cover 36 is inserted over the flange 302 on the surge ground frame 94 with the flange 302 and internal aperture 304 extending outward extending outward through the aperture 328 from the front wall of the terminal cover 36. A wire seal, not shown, is then inserted through the aperture 304 to seal the terminal cover 36 on the socket adapter 10 as well as to provide an indication of any unauthorized tampering with or removal of the terminal cover 36 from the socket adapter 10.

The unique construction of the surge ground conductor frame 94 grounds the wire seal to the support member secured to the hangar 310. This is due to the integral terminal frame on the surge ground conductor frame 94 which carries the aperture flange 302 receiving the wire seal. Further, the ribs 290 on the surge ground frame 94 contact and ground the sealing ring 20 separate from the wire seal.

Further, as shown in FIG. 19, when the surge ground frame 94 is mounted in the front housing 32, as described above, the edges 282 and 284 of the ring 280 overlay opposed ends of the rim filler 240 on the front housing 32. The break away tab 240 thus fills the discontinuity in the ring 280 between the ends 282 and 284 of the ring 280. However, the break away tab 240 can be broken away from the remainder of the front housing 32 to provide an opening or aperture allowing the passage of a conductor, either from an external source or from a watthour meter, through the thus formed opening between the spaced ends 282 and 284 of the ring 280 and an aperture 241 formed in the front housing 32 into the interior cavity between the front housing 32 and the rear housing 30 of the socket adapter 10.

Figure 21:
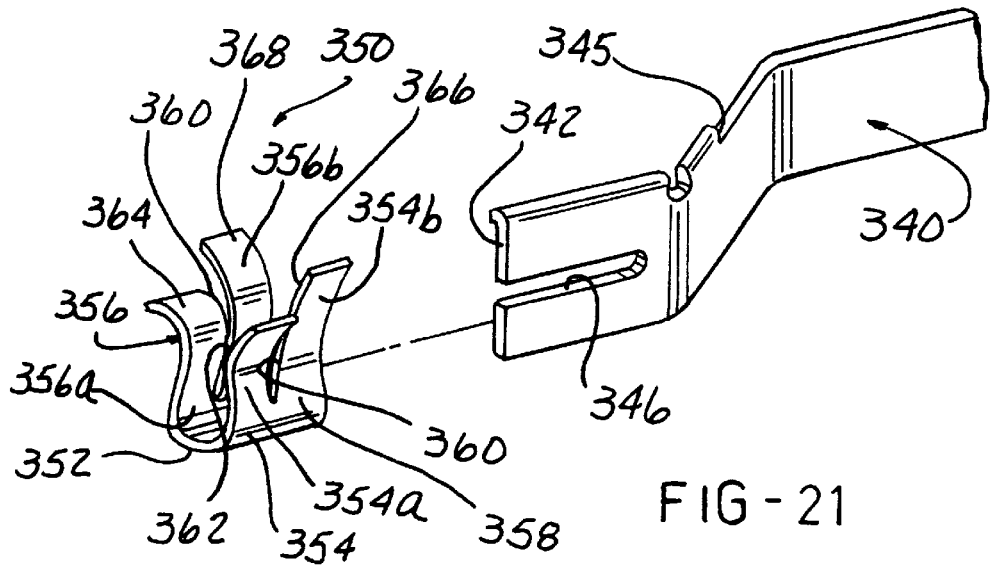
FIG. 21 is a partial, exploded, perspective view showing the mounting of a spring clip on one of the electrical conductors shown in FIG. 20.
Figure 20A:
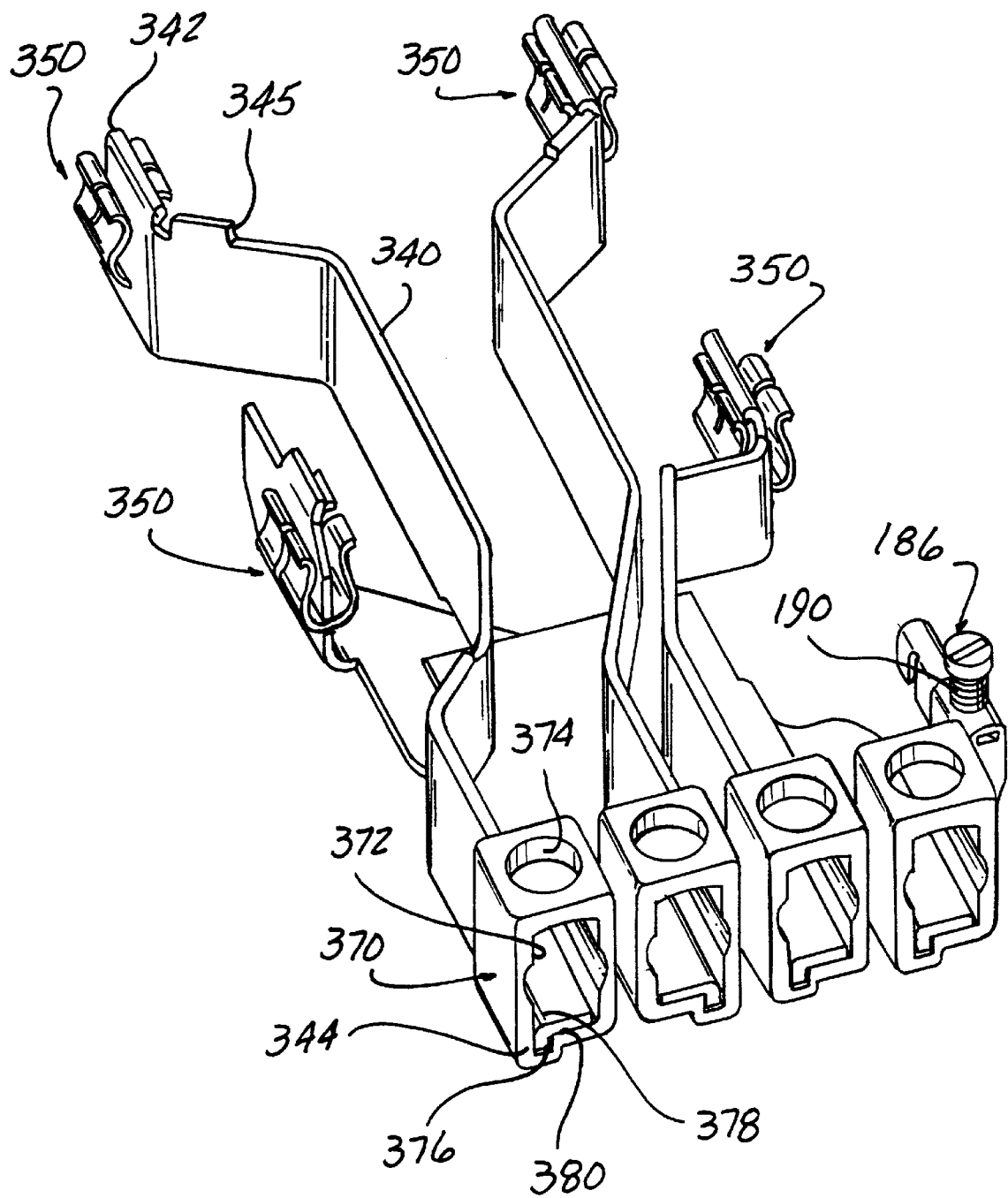
FIG. 20A is a perspective view of a second embodiment of electrical conductors, jaw contact and terminals useable in a watthour meter socket adapter of the present invention.
Figure 20B:
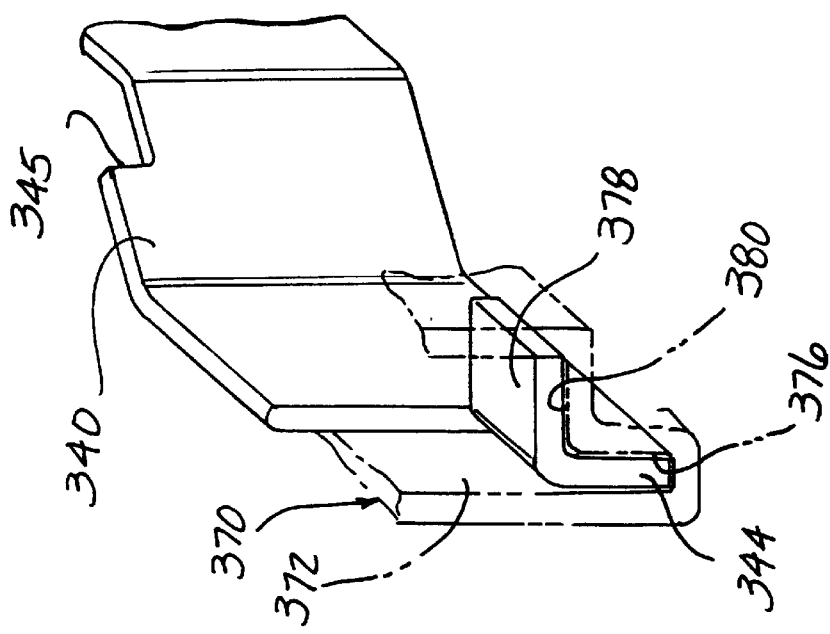
FIG. 20B is an enlarged perspective view showing the end of the conductor and one terminal, with the terminal shown in phantom for clarity.

Referring now to FIGS. 20A, 20B and 21, an alternate embodiment of a conductor, jaw contact and terminal is depicted for high current applications. In this embodiment, each of the line and load conductors, such as conductors 340 is formed of a solid electrically conductive bus bar having a polygonal cross-section. Preferably, each conductor or bus bar 340 is rectangular in cross-section between a first end 342 and opposed second end 344. In a preferred orientation, each conductor or bus bar 340 is oriented with its longer cross-sectional dimension extending perpendicular to the base 40 of the rear housing 30. A cut-out 345 is formed in the width of the bus bar 340 at a location spaced from the first end 342 to provide clearance for internal structure of the surrounding front housing 32.

As shown in FIG. 21, a notch or slot 346 extends axially from the first end 342 of the conductor 340. The slot 346 receives a spring clip 350 in a loose, free floating connection. The spring clip 350 is formed of a spring or resilient material, such as spring steel, and has a base 352 and a pair of side legs 354 and 356 extending outward from opposite sides of the base 352. Each of the side legs 354 and 356 has a smoothly curved, arcuate shape formed of a lower portion 108 extending from the base 352. A slot 360 is formed in each side leg 354 and 356 to divide each side leg 354 and 356 into pairs of contact fingers 354a and 354b for the side leg 354, and 356a and 356b for the side leg 356. Each contact finger 354a, 354b, 356a, 356b projects outwardly from the lower portions 358 to an outer edge which curves outwardly from a contact surface on each contact finger. Contact fingers 354a and 356a have opposed contact surfaces 362 and 364 which are laterally opposed from each other as each of the contact fingers 354 and 356a have the same height, at least to their respective contact surfaces 362 and 364 from the base 352. Likewise, the contact fingers 354b and 356b have opposed, aligned contact surfaces 366 and 368 which are also laterally opposed from one another at the same height from the base 352. The aligned pairs of contact surfaces 362, 364 and 366, 368 may be at the same height along the longitudinal length of the spring clip 350. However, in a preferred embodiment, the height of one of the pairs of contact fingers, such as the height of the contact surfaces 366 and 368 in the pair of contact fingers 354b and 356b extend higher from the base 352 then the height of the other contact surfaces 362 and 364. This staggers the insertion force of a blade terminal into the spring clip 350 while retaining a maximum pull out force.

In use, the spring clip 350 is inserted into the slot 346 in the first end 352 of the bus bar 340. One of the side legs, such as side leg 356 will engage one side of the bus bar 340. The opposed side leg 354 will then be spaced a short distance from the bus bar 340 to define an opening for receiving a blade terminal 18 of a watthour meter 12 therein. Due to the offset height of the pairs of contact surfaces in the spring clip 350, the push-in resistance of the spring clip 350 to the insertion of a blade terminal 18 of a watthour meter 12 is staggered or divided into two steps thereby decreasing the overall push-in force required to fully insert the blade terminal 18 of a watthour meter 12 into the jaw contact 350. At the same time, the total pull-out force resistance which acts to retain the blade terminal 18 in the jaw contact 350 remains at a high level.

The second end 344 of the bus bar or conductor 340 is slidably insertable into a terminal 370 which is similar to the terminal 150 described above and shown in FIG. 7 for the conductors 120 and 122. The terminal 370 in the form of a collar having a first or upper bore 372 for receiving an external electrical conductor therein and an intersecting bore 374 extending through the top of the collar of the terminal 370 which receives a threaded fastener, not shown, for securing the external conductor to the bus bar 340. A second bore 376 is formed in a lower portion of the terminal 370 and opens into communication with the first bore 372.

According to a unique feature of the present invention shown in FIGS. 20A and 20B, the second end 344 of the bus bar 340 is notched and folded over to form a flange 378 which overlays an edge 380 at a bottom portion of the first bore 372 in the terminal 370. At the same time, a lower portion of the second end 344 extends into the second bore 376 in the terminal 370.

This unique folded over, flange arrangement enables less expensive preplated conductive material to be employed to form the bus bar 340. Previous terminal designs which require a bus bar to be stamped or punched out of a sheet of conductive material dispose the raw, unplated cut edge of the bus bar in contact with the external conductor in the terminal. In the above-described terminal and bus bar configuration, the folded over, preplated, flange 378 is disposed in contact with the external conductor within the terminal 370.

In addition, the unique folded over flange arrangement of the present bus bar 340 eliminates the need for costly plating after the bus bar is punched or stamped out of a sheet of conductive material as in prior art terminal/conductor designs.

Figure 24:
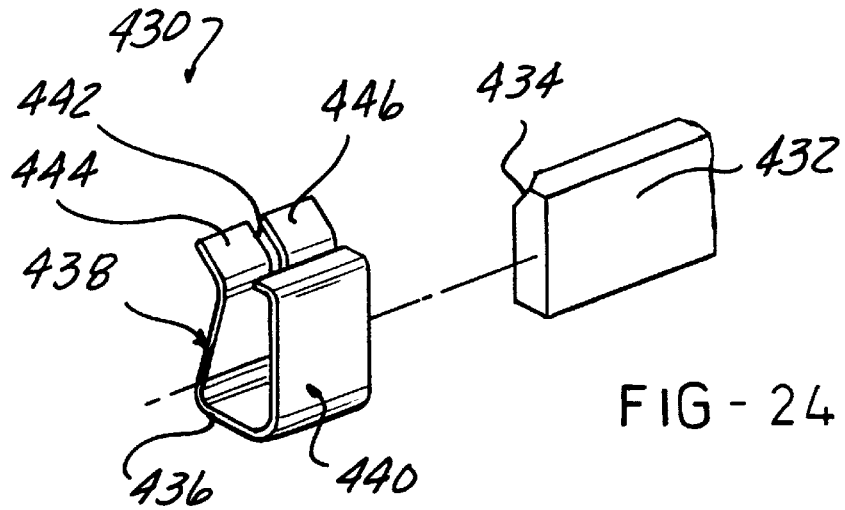
FIG. 24 is an exploded perspective view of an alternate embodiment of a mounting arrangement of a spring clip and one of the electrical conductors.
Figure 25:
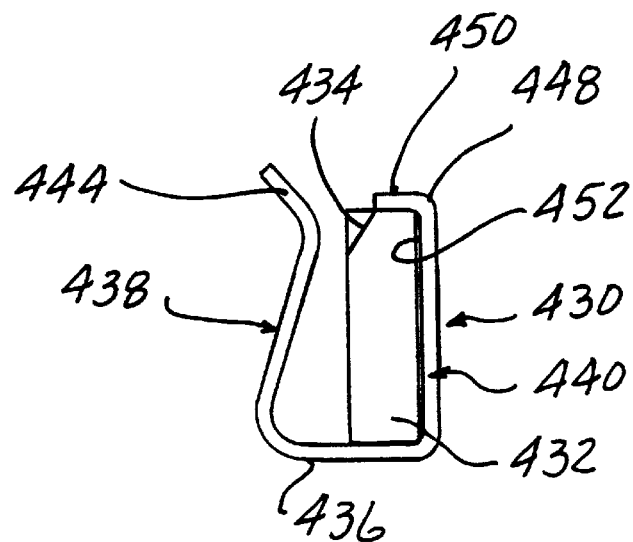
FIG. 25 is an end view of the assembled spring clip and conductor shown in FIG. 24.

Referring now to FIGS. 24 and 25, there is depicted an alternate embodiment of a mounting arrangement between a spring clip 430 and a polygonal electrically conductive conductor or bus bar 432. In this embodiment, the electrical conductor or bus bar 432 has a beveled or angled surface 434 at one end edge which acts as a blade terminal guide surface when the conductor 432 is mounted in the spring clip 430.

The spring clip 430 is somewhat similar to the spring clip 350 described above and shown in FIG. 21 in that the spring clip 430 is formed of a spring or resilient material and has a base 436 and a pair of side legs 438 and 440 extending from opposite side edges of the base 436. The side legs 438 may be formed as a solid single side leg or a split side leg, similar to spring clip 350, in which a slot 442 divides the side leg 438 into two contact fingers 444 and 446. The contact fingers 444 and 446 may be of equal or unequal length in the same manner as shown in FIG. 21.

The opposite side leg 440 has a generally planar configuration extending from one side edge of the base 436 to an upper end 448 and may be a solid member or a split member. A flange 450 projects from the upper end 448 toward the side leg 438 and is disposed generally parallel to and spaced from the base 436 as shown in FIG. 25. The length of the side leg 440 between the base 436 and the top flange 450 is selected to be substantially the same as the height of the conductor 432. This enables the conductor 432 to be slidably inserted into a cavity 452 formed between the top flange 450, the base 436 and the side leg 440 so as to couple the spring clip 430 and the conductor 432. As shown in FIG. 25, when the spring clip 430 is mounted on the end of the conductor 432, the beveled surface 434 on the end of the conductor 432 projects inwardly from the inner edge of the top flange 450 to act as a guide surface for a watthour meter blade terminal to guide the blade terminal between one side edge of the conductor 432 and the opposed side leg 438 of the spring clip 430.

The end of the conductor 432 may project outwardly beyond the end of the spring clip 430, as shown in FIGS. 5 and 7, to enable the end of the conductor 432 to seat on a support in the watthour meter socket adapter housing and to position the jaw contact formed of the spring clip 430 and the end of the conductor 432 at a predetermined location within housing for receiving a watthour meter blade terminal therein.

Figure 26:
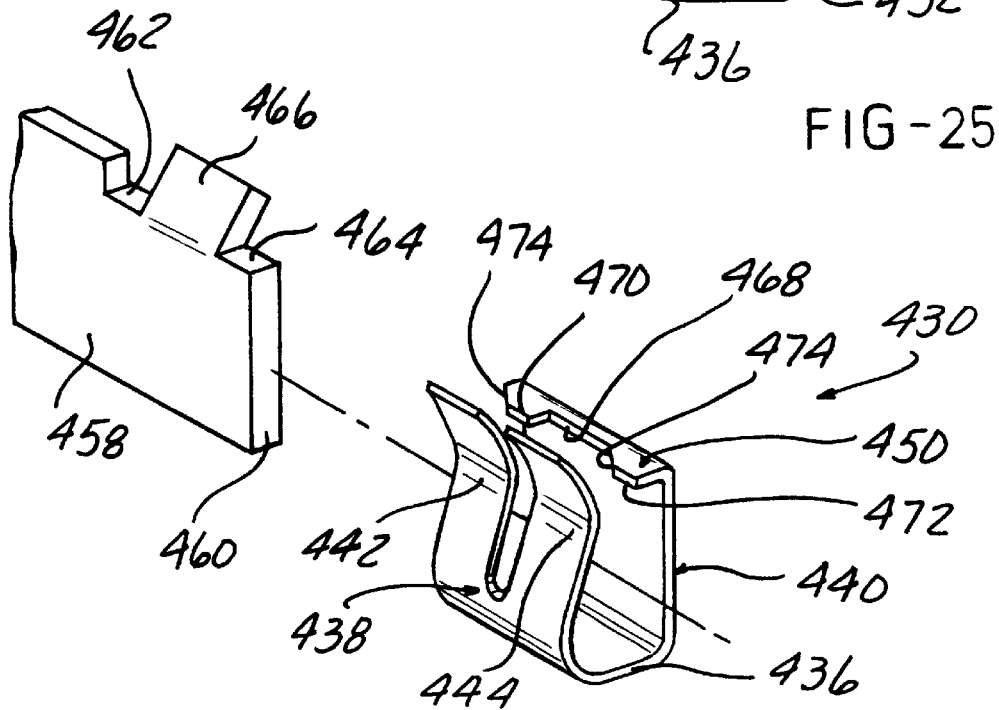
FIG. 26 is an exploded perspective view of yet another mounting arrangement of a spring clip and electrical conductor.

FIGS. 26–29 depict a snap together connection or mounting arrangement between a spring clip and a polygonal shaped electrical conductor or bus bar. In FIG. 26, a polygonal electrical conductor or bus bar 458 is formed with a pair of longitudinally spaced apertures or recesses 462 and 464 along one side edge extending from one end 460. A flange 466 is interposed between the spaced recesses 462 and 464 and preferably is angled from the plane of the bus bar 458 to act as a blade terminal guide surface.

The spring clip 430 shown in FIG. 25 may be employed with the conductor 458 with one modification. In this embodiment, the top flange 450 projecting generally perpendicularly from one end of the side leg 440 is formed with a notch or aperture 468. The notch 468 forms a pair of spaced projections 470 and 472 which extend toward the opposite side leg 438. One side edge 474 of each projection 470 and 472 is angled or beveled to act as a guide surface when the spring clip 430 is slidably urged onto the conductor 458. During this mating engagement, the conductor 458 slides along the angled surface 474 and bends or urges the side leg 440 outwardly from the opposed 438 until the flange 466 on the conductor 458 seats within the notch 468 in the top flange 450 of the spring clip 430. At this time, the projections 470 and 472 seat within the apertures 462 and 464 on the conductor 458 to securely, yet releasibly couple the spring clip 430 to the conductor 458 without the need for mechanical fasteners, such as rivets, nuts and bolts, etc.

Forming the side leg 440 of the spring clip 430 as a two part or ginger member like the side leg 438 will reduce the amount of push-on force required to slide the spring clip 430 onto the conductor 458 since only each finger of the side leg 430 is bent outward at one time.

Another embodiment of a snap together mounting arrangement of the conductor 432 and the spring clip 430 is shown in FIGS. 27 and 28. In this embodiment, the conductor or bus bar 432, which is identical to the conductor 432 described above and shown in FIG. 24, has an aperture 478 extending laterally therethrough at a location spaced from one end 480 of the conductor 432. A spring clip 430, which in this embodiment, has a first side leg 482 formed as a solid, one piece, undivided member 482, also has a second side leg 440 extending from an opposite side edge of the base 436. The top flange 450 in this embodiment is formed with a single inward extending projection 484 which extends toward the first side leg 438. The height of the second side leg 440 from the base 436 to the top flange 450 is selected to enable the projection 484 to snap into the aperture or bore 478 in the conductor 432 to join the conductor 432 and the spring clip 430 together. The projection 484 and the bore 478 releasibly mount the spring clip 430 on the conductor 432.

Finally, there is depicted another mounting arrangement of the conductor 458 and a spring clip 490 in FIG. 29. In this embodiment, the conductor 458 is identically constructed to the conductor 458 described above and shown in FIG. 26. The spring clip 490 is formed as a bent wire frame constructed of a one-piece spring steel wire. The wire is bent to form a pair of first and second side legs 492, 494 which are spaced apart in the direction of the longitudinal axis of the conductor or bus bar 458. The top ends of each of the first and second side legs 492 and 494 are bent generally perpendicularly to the first and second legs 492 and 494 to form projecting ends 496 and 498, respectively. Integral connector portions 500 and 502 interconnect the opposite ends of each of the first and second legs 492 and 494 with a pair of third and fourth legs 504 and 506, respectively. The pair of third and fourth legs 504 and 506 are bent to a shape similar to the shape of the first leg 438 of the spring clip 430 shown in FIGS. 25 and 26 and are spaced from one of the first and second legs 492 and 494, respectively. The upper ends of the third and fourth ends 504 and 506 are interconnected by a longitudinally extending cross member 508. The inwardmost portions 510 and 512 of the third and fourth legs 504 and 506 form contact surfaces which engage a watthour meter blade terminal inserted between the third and fourth legs 504 and 506 and the conductor 458 which is slidably mounted adjacent the first and second side legs 492 and 494. The mounting of the conductor 458 in the spring clip 490 is achieved by urging the conductor 458 and the spring clip 490 together until the top ends 496 and 498 of the first and second legs 492 and 494, respectively, snap into engagement with the notches 462 and 464, respectively, on the conductor 458. In this mounting arrangement, the angled flange 466 on the conductor 458 extends between the top ends 496 and 498 of the spring clip 490.

Alternately, the top ends 496 and 498 can also engage a pair of apertures in the conductor 458, similar to the aperture 478 shown in FIG. 27.

Figure 23:
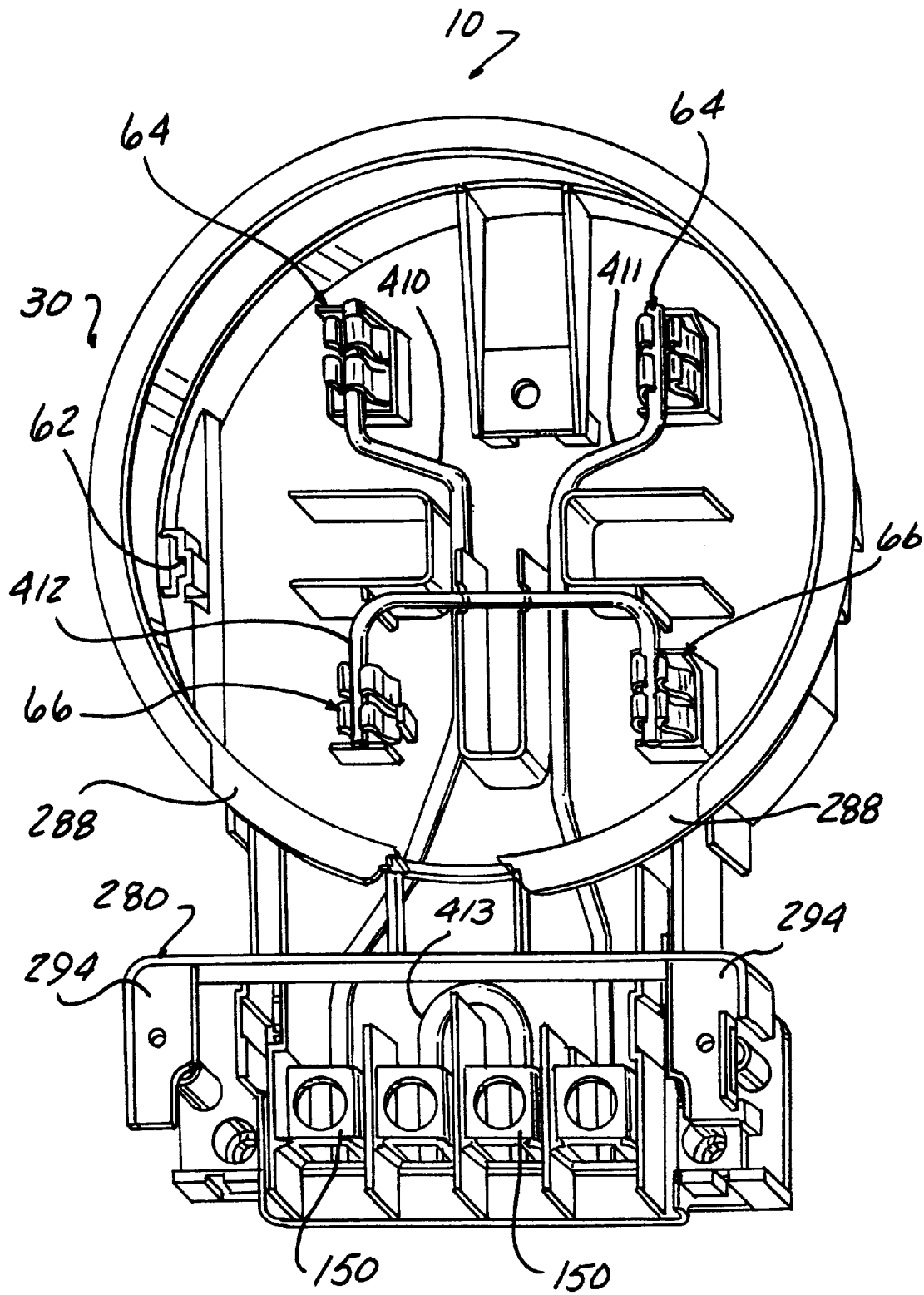
FIG. 23 is a perspective view of a watthour meter socket adapter constructed in accordance with an alternate embodiment of the present invention showing a two wire service and interconnected jaw contacts, conductors and terminals.

Referring now to FIG. 23, there is depicted a two-wire single phase socket adapter which utilizes all the features of the present invention described above. The socket adapter 10 shown in FIG. 23 is identically constructed as the socket adapter described above. For clarity, only the rear housing 30 is depicted in FIG. 23. In this type of electrical service, only two conductors 410 and 411 extend from the jaw contacts 30 to respective outermost terminals which are mounted in the terminal portion of the rear housing 30. The jaw contacts 66 are interconnected by a jumper 412 may be formed of the same round cross-section conductors as the conductors 410 and 411 or the conductors 120 and 122 described above. Similarly, the two innermost mounted terminals are interconnected by a jumper 413, also of round cross-section.

The socket adapter 10 shown in FIG. 23 may also employ the flat, bus bar conductors described above, such as bus bar conductor 340 shown in FIG. 20A. In this embodiment, the jumper 412 has a center portion bent generally perpendicular to the outer ends which are mountable in the jaw contact 66. Alternately, the modified socket adapter 10 shown in FIG. 23 may employ a combination of round cross-sections conductors 410, 411, etc., with flat conductors, such as conductors 340, etc.

What is claimed:

1. A watthour meter socket adapter for use with a watthour meter having a plurality of blade terminals, the watthour meter socket adapter comprising:

a housing;

plurality of jaw contacts disposed in the housing for receiving blade terminals of a watthour meter;

a plurality of terminals disposed in the housing;

a plurality of electrical conductors, at least one conductor extending between and coupled to one jaw contact and one terminal; and the jaw contacts including spring clip means, mounted on one conductor, for biasing a blade terminal of a watthour meter inserted therein into direct electrical connection with the one conductor.

2. The watthour meter socket adapter of claim 1 wherein the spring clip means comprises:

a one piece resilient member; and means, carried on the member, for receiving one end of one conductor therein.

3. The watthour meter socket adapter of claim 2 wherein:

at least one conductor has a circular cross-section;

the one piece member having an integrally connected base and opposed side legs extending from the base.

4. The watthour meter socket adapter of claim 2 wherein the means for receiving one end of one conductor comprises;

an outer end of one of the side legs having a recess receiving one end of the one conductor.

5. The watthour meter socket adapter of claim 4 wherein the one conductor is slidably received in the recess.

6. The watthour meter socket adapter of claim 1 further comprising:

means, carried on the spring clip means, for movably receiving one end of one conductor in the spring clip means.

7. The watthour meter socket adapter of claim 1 wherein:
the one conductor has a polygonal cross-section;
an open ended slot formed in one end of the conductor and extending axially along the one conductor from the one end; and
the spring clip means mounted in the slot.

8. The watthour meter socket adapter of claim 7 wherein the spring clip means comprises:
the member having a base and a pair of opposed side legs projecting from the base, one of the side legs engageable with the conductor when the one piece member is mounted in the slot in the conductor, the opposed side leg spaced from the conductor to define a slot for receiving a blade terminal, the one piece member urging the conductor and an inserted blade terminal into electrical contact.

9. The watthour meter socket adapter of claim 8 wherein the spring clip means further comprises:
a slot formed in each of the side legs defining first and second contact fingers in each of the side legs;
each of the first and second contact fingers having a contact surface engageable with one of the conductor and an inserted blade terminal; and
a height of the opposed contact surfaces of the first contact fingers of the pair of side legs with respect to the base disposed at a different height from the base than a height of the opposed contact surfaces of the second contact fingers of the pair of side legs.

10. A watthour meter socket adapter for use with a watthour meter having a plurality of blade terminals, the watthour meter socket adapter comprising:
a housing;
a plurality of jaw contacts disposed in the housing for receiving blade terminals of a watthour meter;
a plurality of terminals disposed in the housing;
a plurality of electrical conductors, at least one conductor extending between and coupled to one jaw contact and one terminal, the conductors being bare conductors;
at least one of the conductors overlaying at least one of the other conductors between the respective jaw contacts and terminals; and
separate insulation means, disposed between the one conductor and the other overlapped conductor, for electrically insulating the one conductor from the over lapped other conductor.

11. The watthour meter socket adapter of claim 10 further comprising:
means, mounted in the housing, for positioning the insulation means in the housing.

12. A watthour meter socket adapter for use with a watthour meter having a plurality of blade terminals, the watthour meter socket adapter comprising:
a housing;
a plurality of jaw contacts disposed in the housing for receiving blade terminals of a watthour meter;
a plurality of terminals disposed in the housing; and
a plurality of electrical conductors, at least one conductor extending between and coupled to one jaw contact and one terminal;
the terminals including:
a terminal collar having first and second bores extending therethrough, the first and second bores disposed in communication;
means for securing an external electrical conductor in the first bore; and
the second bore having a circular cross-section for receiving a circular cross-section conductor, a portion of the conductor projecting from the second bore into the first bore for electrical contact with an external electrical conductor disposed in the first bore.

13. A watthour meter socket adapter for use with a watthour meter having a plurality of blade terminals, the watthour meter socket adapter comprising:
a housing;
a plurality of jaw contacts disposed in the housing for receiving blade terminals of a watthour meter;
a plurality of terminals disposed in the housing; and
a plurality of electrical conductors, at least one conductor extending between and coupled to one jaw contact and one terminal, at least one conductor having a polygonal shape;
the terminals including:
a terminal collar having first and second bores extending therethrough, the first and second bores disposed in communication;
means for securing an external electrical conductor in the first bore; and
the second bore having a polygonal cross-section for receiving one polygonal shaped conductor;
one end of the polygonal shaped conductor having a flange disposed angularly from a plane of an axial extent of the polygonal shaped conductor; and
the flange overlaying a bottom portion of the terminal collar in the first bore and disposed for direct electrical contact with an external conductor disposed in the first bore.

14. The watthour meter socket adapter of claim 13 wherein the flange extends angularly from a lower end portion of the polygonal shaped conductor, the lower end portion extending substantially axially from the polygonal shaped conductor.

15. The watthour meter socket adapter of claim 14 wherein the flange is substantially perpendicular to the lower end portion.

16. The watthour meter socket adapter of claim 13 wherein:
the second bore in the terminal collar is laterally offset from a center of a width of the terminal collar.

17. A watthour meter socket adapter for use with a watthour meter having a plurality of blade terminals, the watthour meter socket adapter comprising:
a housing;
a plurality of jaw contacts disposed in the housing for receiving blade terminals of a watthour meter;
a plurality of terminals disposed in the housing; and
a plurality of electrical conductors, at least one conductor extending between and coupled to one jaw contact and one terminal;
the terminal including:
a terminal collar;
means for securing an external electrical conductor in the terminal collar;
means for disposing one end of one of the plurality of conductors in the housing in the terminal collar;
dividers carried in the housing defining a plurality of channels, each receiving one terminal collar therein;
the channels opening through one end of the housing for receiving the external electrical conductor therein; and the terminal collars being equally spaced across the end of the housing.

18. A watthour meter socket adapter for use with a watthour meter having a plurality of blade terminals, the watthour meter socket adapter comprising:
   a housing, the housing including:
      a base having a central wall, an annular side wall projecting from central wall and terminating in a watthour meter mounting flange;
      the annular wall and the base defining a watthour meter receiving portion;
      the base having a terminal portion extending from the watthour meter receiving portion; and
      a surge ground frame mounted in the housing and connectable to electrical ground, the surge ground frame including:
         an annular ring mounted within the annular side wall of the housing; and
         a terminal frame extending from the ring and mountable over the terminal portion of the base;
   a plurality of jaw contacts disposed in the housing for receiving blade terminals of a watthour meter;
   a plurality of terminals disposed in the housing; and
   a plurality of electrical conductors, at least one conductor extending between and coupled to one jaw contact and one terminal.

19. The watthour meter socket adapter of claim 18 wherein:
   the housing is formed of front and rear housings, each including a watthour meter receiving portion and a terminal portion;
   the terminal portion of the surge ground frame overlaying the terminal portion of the front housing; and
   means for joining the terminal portion of the surge ground frame to the front housing and the rear housing.

20. The watthour meter socket adapter of claim 18 wherein the surge ground frame further comprises:
   an apertured flange extending from the terminal frame of the surge ground frame;
   the flange extendible through an aperture in a terminal cover when the terminal cover is mounted over the terminal portion of the housing; and
   seal means insertable through the apertured flange to sealingly couple the terminal cover to the housing; and
   means for electrically grounding the wire seal and the surge ground flange.

21. The watthour meter socket adapter of claim 18 further comprising:
   the annular side wall of the housing having a discontinuity between the watthour meter receiving portion and the terminal portion;
   the annular ring of the surge ground frame having a discontinuity formed by first and second spaced ends, first and second spaced ends disposed in the discontinuity in the annular side wall of the housing; and
   rim filler means, carried on the housing between the watthour meter receiving portion and the terminal portion of the housing, for substantially filling the discontinuity between a first and second spaced ends of the annular ring and the surge ground frame.

22. The watthour meter socket adapter of claim 21 wherein:
   the rim filler is frangibly connected to the housing for forming an opening into the housing when separated from the housing.

23. The watthour meter socket adapter of claim 18 further comprising:
   an aperture formed in the housing;
   fastener means, extendible through the aperture into engagement with a mount, for mounting the housing to a support surface; and
   hanger means, carried by the surge ground frame, for connecting the surge ground frame to the fastener means extendible through the aperture in the housing.

24. The watthour meter socket adapter of claim 23 wherein the hanger means comprises:
   a mounting pad having an aperture alignable with the aperture in the housing, the pad carried by the annular ring of the surge ground frame.

25. The watthour meter socket adapter of claim 22 wherein the surge ground frame further comprises:
   at least one rib extending from the ring to the terminal portion to connect the ring to the terminal portion.

26. A watthour meter socket adapter for use with a watthour meter having a plurality of blade terminals, the watthour meter socket adapter comprising:
   a housing;
   a plurality of jaw contacts disposed in the housing for receiving blade terminals of a watthour meter;
   a plurality of terminals disposed in the housing; and
   a plurality of electrical conductors, at least one conductor extending between and coupled to one jaw contact and one terminal;
   the housing including:
      a rear housing having a central wall and an annular side wall extending from the central wall;
      a front housing having a substantially planar wall with a peripheral edge, a plurality of apertures formed in the planar wall;
      the front housing mounted in the rear housing with the peripheral edge of the front housing supported on the annular side wall of the rear housing and spaced from the central wall of the rear housing to define an interior cavity, the plurality of jaw contacts, the plurality of terminals and the plurality of conductors disposed within the interior cavity; and
      each of the apertures in the planar wall of the front housing alignable with one of the jaw contacts disposed within the interior cavity of the housing.

27. The watthour meter socket adapter of claim 26 further comprising:
   means, formed on at least one of the front housing and rear housing, for positioning one jaw contact.

28. The watthour meter socket adapter of claim 27 wherein:
   one end of one electrical conductor is supported on the positioning means.

29. The watthour meter socket adapter of claim 27 further comprising:
   support means, carried on the central wall of the rear housing, for supporting a jaw contact within the positioning means.

30. The watthour meter socket adapter of claim 26 further comprising:
   means, formed on the planar wall of the front housing, for mounting a switch on the planar wall of the front housing.

31. The watthour meter socket adapter of claim 30 wherein the means for mounting the switch on the planar wall of the front housing comprises:

a peripheral frame extending from the peripheral edge of the front housing; and an aperture formed in the peripheral frame for receiving the switch therein.

32. The watthour meter socket adapter of claim 26 further comprising:

a plurality of recesses formed on an inside surface of the planar wall of the front housing facing the rear housing;

each recess receiving one jaw contact therein;

the jaw contact having a planar base with first and second spaced legs extending therefrom;

a third leg disposed intermediate the first and second legs and projecting from the base, the third leg extending angularly oppositely from the first and second legs to define a slot between the first, second and third legs for receiving a blade terminal therein;

pockets formed in the recess on the inside surface of the front housing for receiving outer ends of the first and second fingers in a fixed relationship; and a pocket formed on the inside surface of the front housing and spaced from the third finger for enabling movement of the third finger relative to the first and second fingers.

33. A watthour meter socket adapter for use with a watthour meter having a plurality of blade terminals, the watthour meter socket adapter comprising:

a housing;

a plurality of jaw contacts disposed in the housing for receiving blade terminals of a watthour meter;

a plurality of terminals disposed in the housing; and a plurality of electrical conductors at least one conductor extending between and coupled to one jaw contact and one terminal;

the housing having:

a watthour meter receiving portion;

a terminal portion carried on the housing and having a front wall including a plurality of hollow bosses allowing access to terminals disposed in the terminal portion;

a first aperture formed in the front wall of the terminal portion for allowing access to an additional terminal disposed the terminal portion; and means, adjacent to the first aperture, for allowing visual access to an external electrical conductor extending through the housing to the additional terminal.

34. The watthour meter socket adapter of claim 33 wherein:

the visual access allowing means comprising an additional aperture formed in the front wall adjacent to the first aperture.

35. The watthour meter socket adapter of claim 34 further comprises:

an aperture formed in an end of the terminal portion of the housing for insertion of an external conductor to the additional terminal, the additional aperture aligned with the aperture in the end of the housing and the another terminal.

36. A watthour meter socket adapter for use with a watthour meter having a plurality of blade terminals, the watthour meter socket adapter comprising:

a housing;

a plurality of jaw contacts disposed in the housing for receiving blade terminals of a watthour meter;

a plurality of terminals disposed in the housing;

a plurality of electrical conductors at least one conductor extending between and coupled to one jaw contact and one terminal; and means, carried on the housing, for receiving an external communications conductor.

37. The watthour meter socket adapter of claim 36 wherein the receiving means further comprises:

means for mounting a communications connector in the receiving means.

38. The watthour meter socket adapter of claim 37 further comprising:

means for lockably covering the communications conductor receiving means.

39. The watthour meter socket adapter of claim 38 wherein the covering means comprises:

a cover closably mountable on the housing and covering all external portions of the communications conductor receiving means.

40. The watthour meter socket adapter of claim 39 further comprising:

means for releasibly fixing the covering means to the housing.

41. The watthour meter socket adapter of claim 40 wherein the fixing means comprises:

a aperture formed in the housing adjacent the communications conductor receiving means;

an aperture formed in the cover alignable with the aperture in the housing when the cover is mounted on the housing; and fastener means, extendable through the aligned apertures in the housing and the cover for releasibly fastening the cover to the housing.

42. The watthour meter socket adapter of claim 41 further comprising:

the housing including a base having a central wall, an annular sidewall projecting from the central wall;

a surge ground frame mounted in the housing and connectable to electrical ground, the surge ground frame including:

an annular ring mounted within the annular sidewall of the housing;

at least one aperture formed in the annular ring; and the at least aperture alignable with the aperture in the housing adjacent the communications conductor receiving means for receiving the fastener means therethrough to fixedly interconnect and electrically ground the surge ground frame and the cover.

43. The watthour meter socket adapter of claim 42 wherein:

a pair of tabs project from diametrically opposed portions of the annular ring;

the apertures in the annular ring being formed in the tabs.

44. The watthour meter socket adapter of claim 36 wherein the receiving means comprises:

means for mounting a telephone jack in the housing to receive an external communications conductor.

45. The watthour meter socket adapter of claim 44 wherein the mounting means comprises:

an aperture formed in the side wall of the housing, the aperture receiving the telephone jack therein.

46. A watthour meter socket adapter for use with a watthour meter having a plurality of blade terminals, the watthour meter socket adapter comprising:

a housing;

a plurality of jaw contacts disposed in the housing for receiving blade terminals of a watthour meter;

a plurality of terminals disposed in the housing; and a plurality of electrical conductors, at least one conductor extending between and coupled to one jaw contact and one terminal;

the housing including:
- a rear housing having a central wall and an annular side wall extending from the central wall;
- a front housing having a substantially planar wall with a peripheral edge, a plurality of apertures formed in the planar wall;
- the front housing mounted in the rear housing with the peripheral edge of the front wall supported on the annular side wall of the rear housing and spaced from the central wall of the rear housing to define an interior cavity, the plurality of jaw contacts, the plurality of terminals and the plurality of conductors disposed within the interior cavity; and
- one aperture in the planar wall of the front housing alignable with one of the jaw contacts disposed within the interior cavity of the housing;

the jaw contacts including spring clip means, movably mounted on one conductor, for biasing a blade terminal of a watthour meter inserted therein into direct electrical connection with the one conductor.

47. The watthour meter socket adapter of claim 46 wherein spring clip means comprises:
   a one piece resilient member; and
   means, carried on the member, for receiving one end of one conductor therein.

48. The watthour meter socket adapter of claim 47 wherein:
   at least one conductor has a circular cross-section;
   the one piece member having an integrally connected base and opposed side legs extending from the base.

49. The watthour meter socket adapter of claim 48 wherein the means for receiving one end of one conductor comprises;
   an outer end of one of the side legs having a recess receiving one end of the one conductor.

50. The watthour meter socket adapter of claim 49 wherein the one conductor is slidably received in the recess.

51. The watthour meter socket adapter of claim 46 wherein:
   the spring clip means comprises:
   means, carried on the spring clip means, for movably receiving one end of one conductor therein.

52. The watthour meter socket adapter of claim 46 further comprising:
   means, formed on at least one of the front housing and rear housing, for positioning one jaw contacts.

53. The watthour meter socket adapter of claim 52 wherein one end of one electrical conductor is supported on the positioning means.

54. The watthour meter socket adapter of claim 46 further comprising:
   conductor support means, carried on the rear housing adjacent one terminal, for supporting at least one conductor on the rear housing.

55. The watthour meter socket adapter of claim 46 wherein:
   the at least one conductor has a polygonal cross-section;
   an open ended slot formed in an end of the at least one conductor and extending axially along the at least one conductor from the end; and
   the spring clip means disposed in the slot.

56. The watthour meter socket adapter of claim 55 wherein the spring clip means comprises:
   the member having a base and a pair of opposed side legs projecting from the base, one of the side legs engageable with the conductor when the one piece member is mounted in the slot in the conductor, the opposed side leg spaced from the conductor to define a slot for receiving a blade terminal, the one piece member urging the conductor and an inserted blade terminal into electrical contact.

57. The watthour meter socket adapter of claim 56 wherein the spring clip means further comprises:
   a slot formed in each of the side legs defining first and second contact fingers in each of the side legs;
   each of the first and second contact fingers having a contact surface engageable with one of the conductor and an inserted blade terminal; and
   a height of the opposed contact surfaces of the first contact fingers of the pair of side legs with respect to the base disposed at a different height from the base than a height of the opposed contact surfaces of the second contact fingers of the pair of side legs.

58. The watthour meter socket adapter of claim 55 wherein the terminals comprise:
   a terminal collar having first and second bores extending therethrough, the first and second bores disposed in communication;
   means for securing an external electrical conductor in the first bore;
   the second bore having a polygonal cross-section for receiving a polygonal shaped conductor;
   one end of the polygonal shaped conductor having a flange disposed angularly from a plane of an axial extent of the polygonal shaped conductor; and
   the flange overlaying a bottom portion of the terminal collar in the first bore and disposed for direct electrical contact with an external conductor disposed in the first bore.

59. The watthour meter socket adapter of claim 58 wherein the flange extends angularly from a lower end portion of the polygonal shaped conductor, the lower end portion extending substantially axially from the polygonal shaped conductor.

60. The watthour meter socket adapter of claim 59 wherein the flange is substantially perpendicular to the lower end portion.

61. The watthour meter socket adapter of claim 59 wherein:
   the second bore in the terminal collar is laterally offset from a center of a width of the terminal collar.

62. The watthour meter socket adapter of claim 58 further comprising:
   dividers carried in the housing defining channels for receiving one terminal collar therein;
   the channels opening through one end of the housing for receiving the external electrical conductor therein; and
   the terminal collars being equally spaced across the end of the housing.

63. A watthour meter socket adapter for use with a watthour meter having a plurality of blade terminals, the watthour meter socket adapter comprising:
   a housing;
   a plurality of jaw contacts disposed in the housing for receiving blade terminals of a watthour meter;
   a plurality of terminals disposed in the housing; and
   a plurality of electrical conductors, at least one conductor extending between and coupled to one jaw contact and one terminal;

the housing including:
  a rear housing having a central wall and an annular side wall extending from the central wall;
  a front housing having a substantially planar wall with a peripheral edge, a plurality of apertures formed in the planar wall;
  the front housing mounted in the rear housing with the peripheral edge of the front wall supported on the annular side wall of the rear housing and spaced from the central wall of the rear housing to define an interior cavity, the plurality of jaw contacts, the plurality of terminals and the plurality of conductors disposed within the interior cavity; and
  one of the apertures in the planar wall of the front housing alignable with one of the jaw contacts disposed within the interior cavity of the housing; and
conductor support means, carried on the rear housing adjacent one terminal, for supporting at least one conductor on the rear housing.

64. The watthour meter socket adapter of claim 54 further comprising:
means, formed on at least one of the front housing and the rear housing, for positioning one jaw contact.

65. A watthour meter socket adapter for use with a watthour meter having a plurality of blade terminals, the watthour meter socket adapter comprising:
a housing;
a plurality of jaw contacts disposed in the housing for receiving blade terminals of a watthour meter;
a plurality of terminals disposed in the housing; and
a plurality of electrical conductors, at least one conductor extending between and coupled to one jaw contact and one terminal;
the housing including:
  a rear housing having a central wall and an annular side wall extending from the central wall;
  a front housing having a substantially planar wall with a peripheral edge, a plurality of apertures formed in the planar wall;
  the front housing mounted in the rear housing with the peripheral edge of the front wall supported on the annular side wall of the rear housing and spaced from the central wall of the rear housing to define an interior cavity, the plurality of jaw contacts, the plurality of terminals and the plurality of conductors disposed within the interior cavity; and
  one of the apertures in the planar wall of the front housing alignable with one of the jaw contacts disposed within the interior cavity of the housing; and the at least one conductor has a polygonal cross-section;
an open ended slot formed in an end of the at least one conductor and extending axially along the at least one conductor from the end; and
spring clip means, movably disposed in the slot, for biasing a blade terminal of a watthour meter inserted therein and into direct electrical connection with the at least one conductor.

66. A watthour meter socket adapter for use with a watthour meter having a plurality of blade terminals, the watthour meter socket adapter comprising:
a housing;
a plurality of jaw contacts disposed in the housing for receiving blade terminals of a watthour meter;
a plurality of terminals disposed in the housing; and
a plurality of electrical conductors, at least one conductor extending between and coupled to one jaw contact and one terminal;
the housing including:
  a rear housing having a central wall and an annular side wall extending from the central wall;
  a front housing having a substantially planar wall with a peripheral edge, a plurality of apertures formed in the planar wall; and
  the front housing mounted in the rear housing with the peripheral edge of the front wall supported on the annular side wall of the rear housing and spaced from the central wall of the rear housing to define an interior cavity, the plurality of jaw contacts, the plurality of terminals and the plurality of conductors disposed within the interior cavity;
at least one conductor having a polygonal cross-section;
the terminals including:
  a terminal collar having first and second bores extending therethrough, the first and second bores disposed in communication;
  means for securing an external electrical conductor in the first bore; and
  the second bore having a polygonal cross-section for receiving a polygonal shaped conductor;
one end of the polygonal shaped conductor having a flange disposed angularly from a plane of an axial extent of the polygonal shaped conductor; and
the flange overlaying a bottom portion of the terminal collar in the first bore and disposed for direct electrical contact with an external conductor disposed in the first bore.

67. A watthour socket adapter for use with a watthour meter having a plurality of blade terminals, the watthour meter socket adapter comprising:
a housing;
a plurality of jaw contacts disposed in the housing for receiving blade terminals of a watthour meter;
a plurality of terminals disposed in the housing;
a plurality of electrical conductors at least one conductor extending between and coupled to one jaw contact and one terminal;
a plurality of electrical conductors, at least one conductor extending between and coupled to one jaw contact and one terminal;
the one conductor having a polygonal cross section; and
means, unitarily carried on at one of the spring clip and the one conductor, for couplingly mounting the spring clip on the one conductor for receiving a watthour blade terminal therebetween.

68. The watthour socket adapter of claim 67 wherein the couplingly means comprises:
the spring clip having opposed side legs extending from a central base, one of the side legs having an end flange projecting from the side leg and forming a cavity in conjunction with the one side leg and the base, the cavity sized for receiving the one conductor therein.

69. The watthour meter socket adapter of claim 67 wherein the couplingly mounting means comprises:
the spring clip having opposed side legs extending from a central base, one of the side legs having at least one projection extending therefrom toward the opposite side leg; and
a mating aperture formed in the one electrical conductor releasibly receiving the projection to mount the spring clip on the conductor.

70. The watthour meter socket adapter of claim 69 wherein the aperture in the one conductor comprises a pair of spaced recesses formed along one side edge of the one conductor;

a flange formed on the one conductor between the pair of spaced recesses;

the at least one projection on the one side leg of the spring clip comprises a pair of spaced projections each releasibly engagable with one of the pair of recesses on the one conductor.

71. The watthour meter socket adapter of claim 70 wherein:

the pair of projections on the spring clip form a recess therebetween which receives the flange on the one conductor.

72. The watthour meter socket adapter of claim 71 wherein the flange is disposed at an angle from a plane of the one conductor.

73. The watthour meter socket adapter of claim 70 wherein:

the recess is an aperture formed in the conductor; and the at least one projection being releasibly engagable with the aperture.

74. The watthour meter socket adapter of claim 70 wherein the couplingly mounted means comprises:

a pair of recesses formed along one side edge of the one conductor;

the spring clip being a wire frame having a first pair of side legs, each terminating in an angularly extending end releasibly mountable in one of the pair of recesses on the side edge of the one conductor;

a pair of cross members extending from a opposite end of each of the first and second legs;

a pair of third and fourth legs joined to the connecting members and extending from the connecting members in spaced relationship from the pair of first and second legs; and a longitudinal cross member connecting one end of the pair of third and fourth legs.

* * * * *